US012400866B2

United States Patent
Yang et al.

(10) Patent No.: US 12,400,866 B2
(45) Date of Patent: Aug. 26, 2025

(54) METHOD AND SYSTEM FOR MANUFACTURING A SEMICONDUCTOR DEVICE

(71) Applicant: TAIWAN SEMICONDUCTOR MANUFACTURING COMPANY, LTD., Hsinchu (TW)

(72) Inventors: Ching-Hai Yang, Taipei (TW); Yao-Hwan Kao, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 614 days.

(21) Appl. No.: 17/745,029

(22) Filed: May 16, 2022

(65) Prior Publication Data
US 2023/0369060 A1 Nov. 16, 2023

(51) Int. Cl.
*H01L 21/308* (2006.01)
*G03F 7/00* (2006.01)

(52) U.S. Cl.
CPC ........ *H01L 21/3086* (2013.01); *G03F 7/7065* (2013.01); *G03F 7/70866* (2013.01); *G03F 7/70933* (2013.01)

(58) Field of Classification Search
CPC .............. H01L 21/3086; G03F 7/7065; G03F 7/70866; G03F 7/70933; G03F 7/32; G03F 7/36; G03F 7/40; G03F 7/70991
USPC .......................................... 438/700; 430/296
See application file for complete search history.

(56) References Cited

U.S. PATENT DOCUMENTS

| | | | |
|---|---|---|---|
| 2003/0022515 A1* | 1/2003 | Nakagawa | B05D 1/005 427/337 |
| 2006/0140624 A1* | 6/2006 | Takasu | G03D 3/00 396/611 |
| 2011/0200953 A1* | 8/2011 | Arima | G03F 7/3021 430/434 |

(Continued)

FOREIGN PATENT DOCUMENTS

| CN | 105655232 B | 8/2019 |
|---|---|---|
| TW | 201727397 A | 8/2017 |

OTHER PUBLICATIONS

Application file history of U.S. Appl. No. 17/462,943, filed Aug. 31, 2021.

*Primary Examiner* — Caleen O Sullivan
(74) *Attorney, Agent, or Firm* — STUDEBAKER BRACKETT PLLC

(57) ABSTRACT

A method for manufacturing a semiconductor device includes forming a photoresist layer that includes a photoresist composition over a wafer to produce a photoresist-coated wafer. The photoresist layer is selectively exposed to actinic radiation to form a latent pattern in the photoresist layer. The latent pattern is developed by applying a developer to the selectively exposed photoresist layer under a first pressure gas flow setting in a development chamber. The photoresist layer is rinsed, under the first pressure gas flow setting, to form a patterned photoresist layer exposing a portion of the wafer in the development chamber. The patterned photoresist layer is spin dried under a second pressure gas flow setting. A pressure of the development chamber under the second pressure gas flow setting is greater than the pressure of the development chamber under the first pressure gas flow setting.

20 Claims, 23 Drawing Sheets

(56) References Cited

U.S. PATENT DOCUMENTS

2023/0062148 A1\* 3/2023 Huang ................ G03F 7/0025

\* cited by examiner

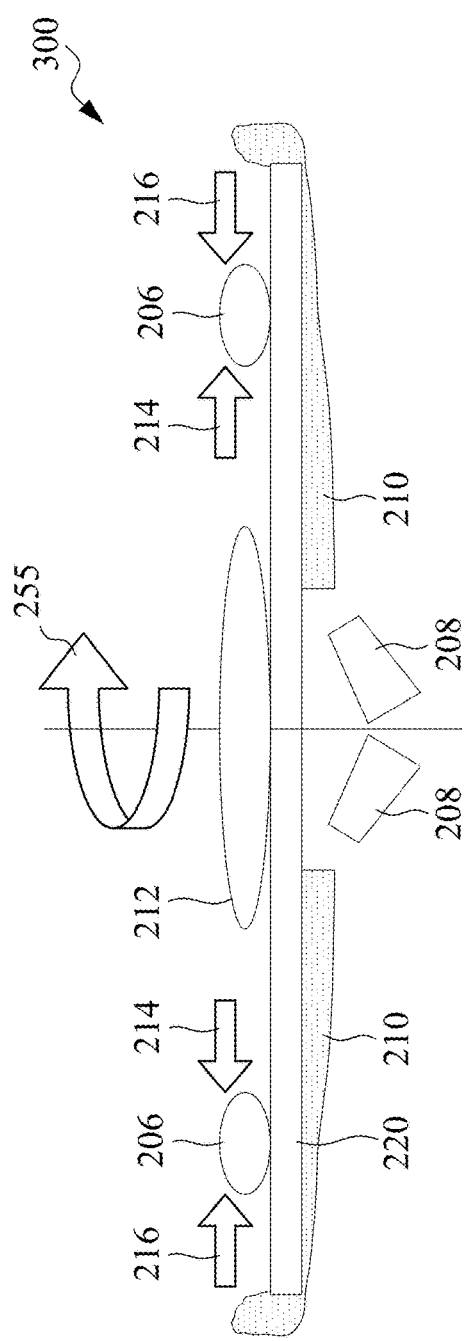
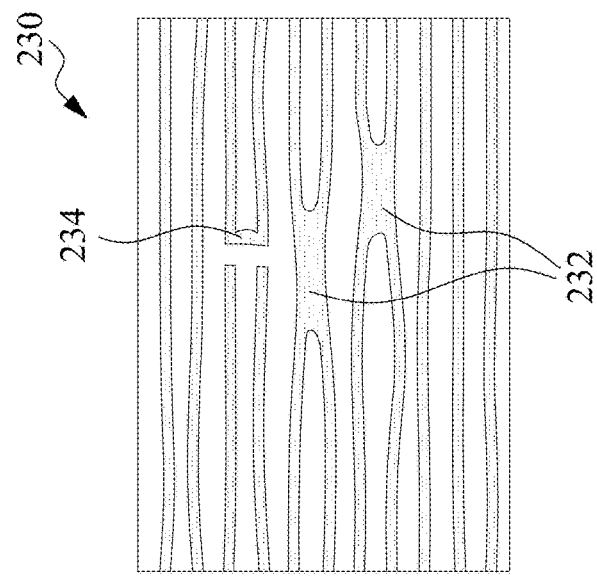
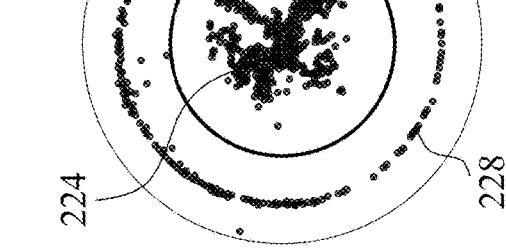
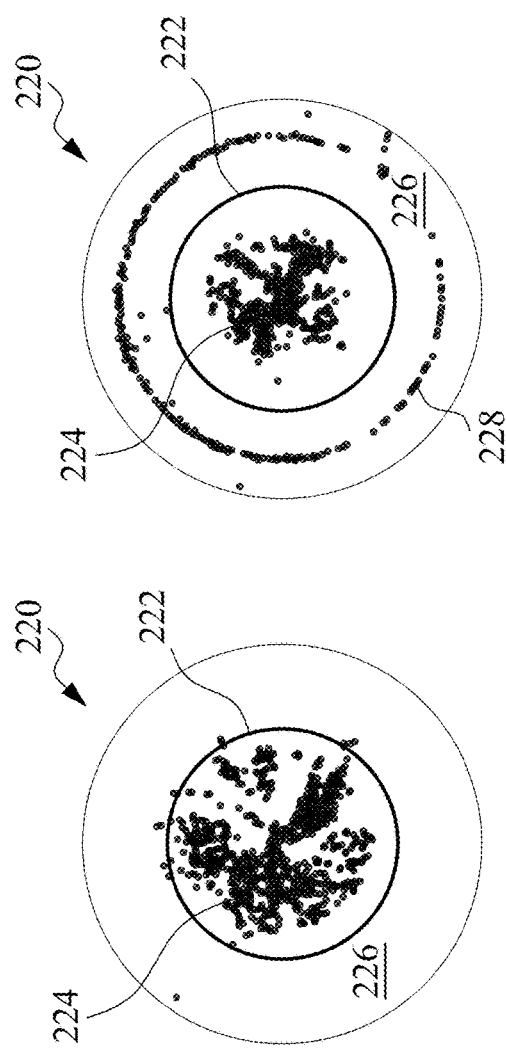
FIG. 7A
FIG. 7D
FIG. 7B
FIG. 7C

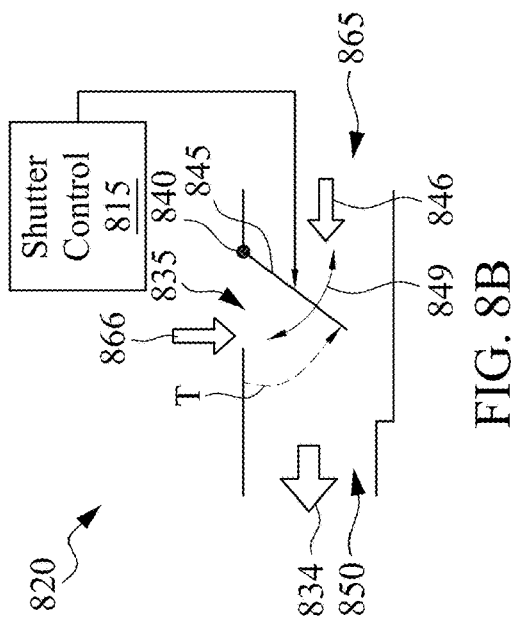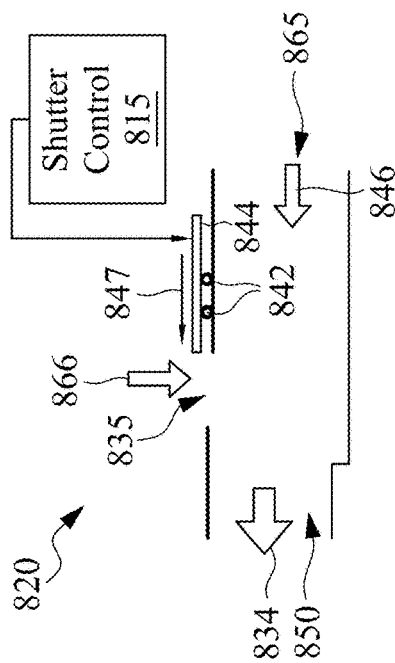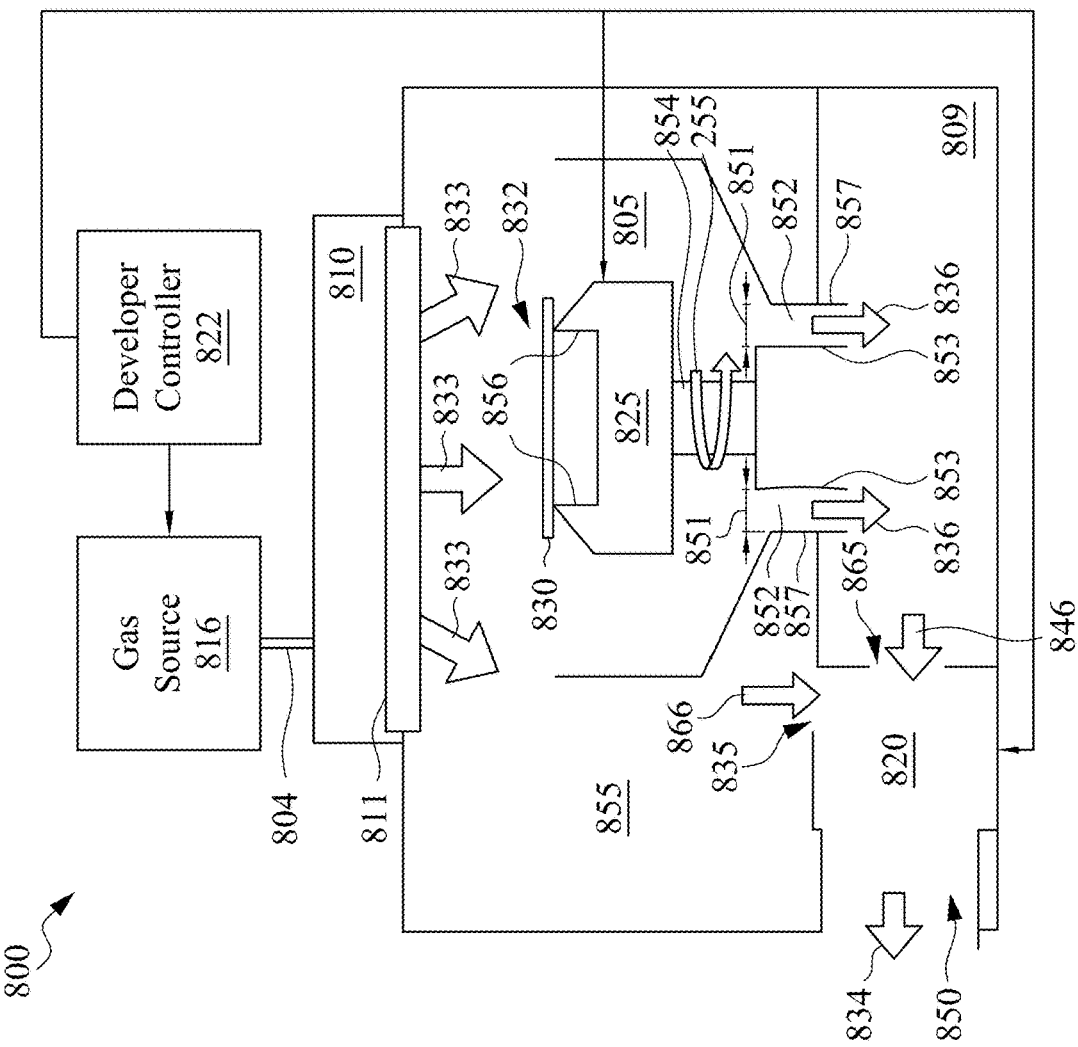

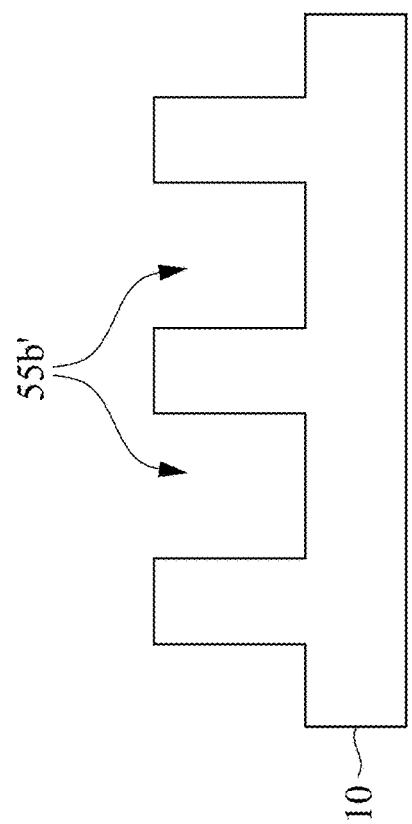
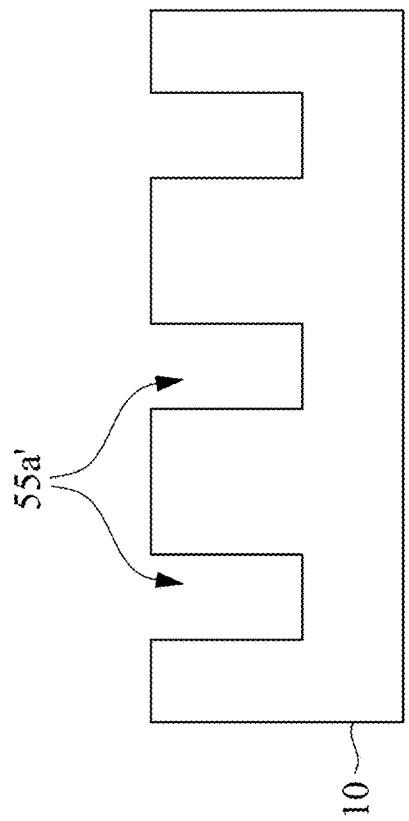
FIG. 9B
FIG. 9A

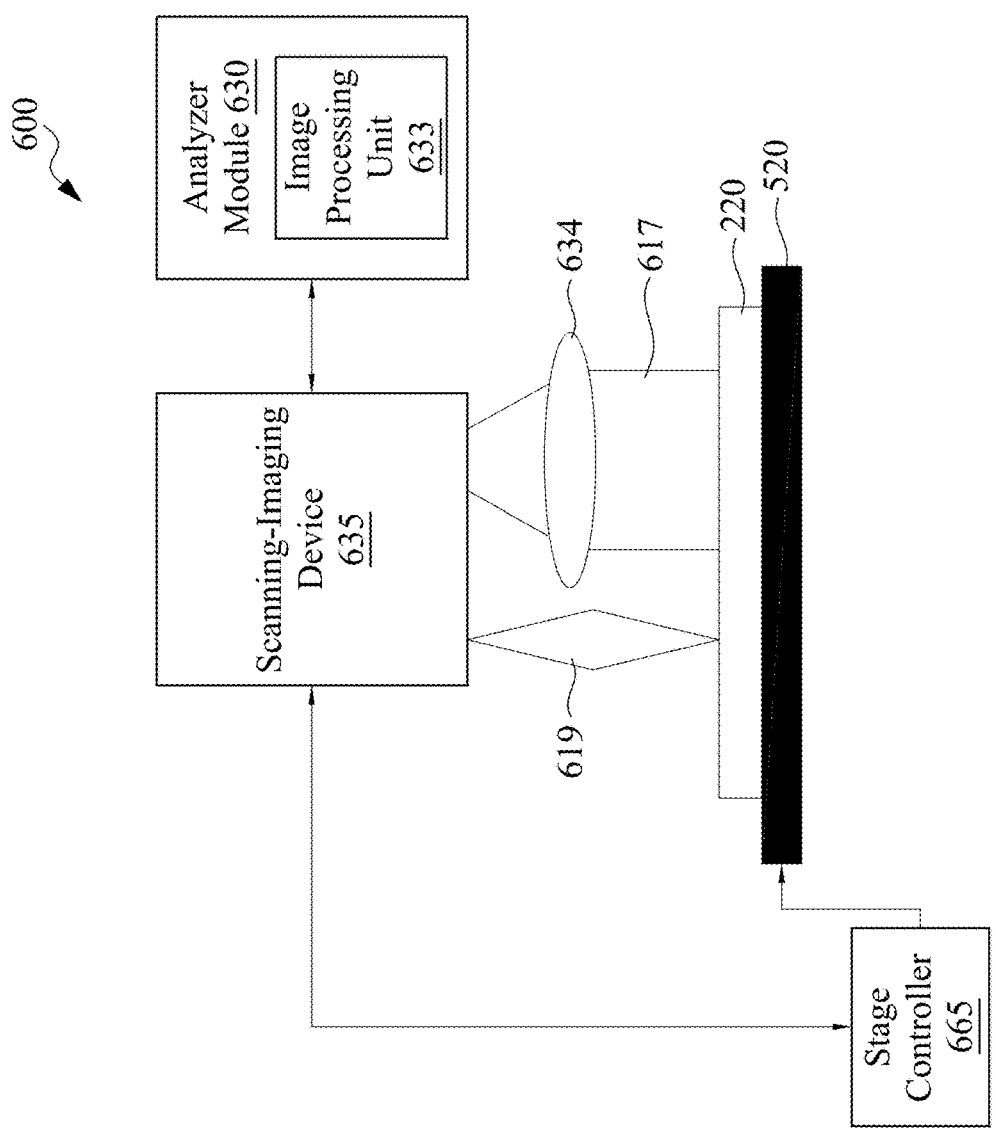

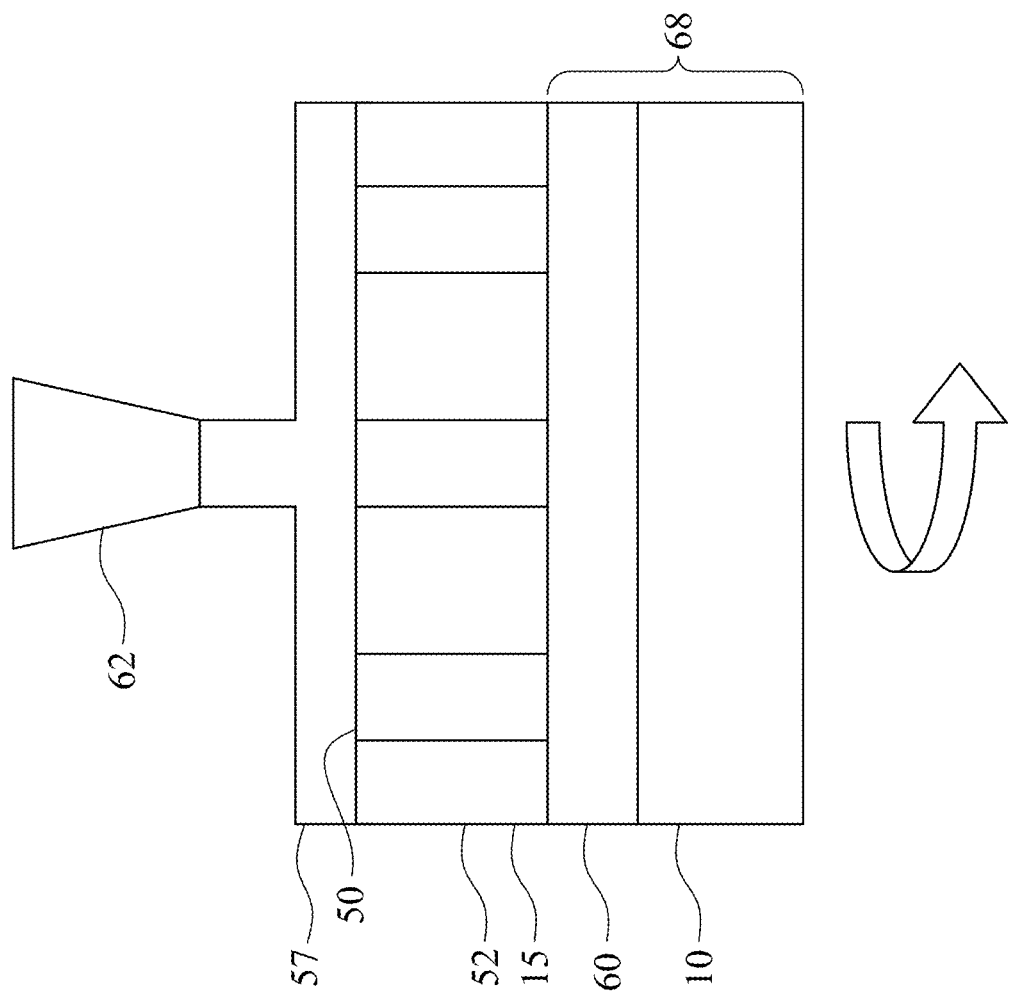

METHOD AND SYSTEM FOR MANUFACTURING A SEMICONDUCTOR DEVICE

BACKGROUND

During an integrated circuit (IC) design, a number of patterns of the IC, for different steps of IC processing, are generated on a substrate. The patterns may be produced by projecting, e.g., imaging, layout patterns of a mask on a photo resist layer of the wafer. A lithographic process transfers the layout patterns of the masks to the photo resist layer of the wafer such that etching, implantation, or other steps are applied only to predefined regions of the wafer. It is desirable that the layout patterns are produced on the substrate with no errors such that etching produces no defects on the substrate.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7A, 7B, 7C, 7D, and 7E show a system for generating a resist pattern and/or an etched pattern on the substrate, developed material residues and water residues on the substrate, a defect caused by the residues in an etched pattern on the substrate, and a graph of the number of pattern collapses on a wafer vs. the spin drying speed.

FIGS. 8A, 8B, 8C, 8D, 8E, 8F, and 8G show a system for generating a resist pattern and/or an etched pattern on the substrate, an exhaust control system of the system for generating the resist pattern and/or the etched pattern on the substrate, and developed material residues and water residues with and without using the exhaust control system in accordance with some embodiments of the present disclosure.

FIGS. 9A and 9B show a process stage of a sequential operation according to an embodiment of the disclosure.

FIGS. 10A and 10B show an inspection system of the residue or defects on a surface of the substrate and controlling the system for generating a resist pattern and/or an etched pattern on the substrate in accordance with some embodiments of the present disclosure.

FIG. 16 shows a process stage of a sequential operation according to an embodiment of the disclosure.

DETAILED DESCRIPTION

Figure 1A:
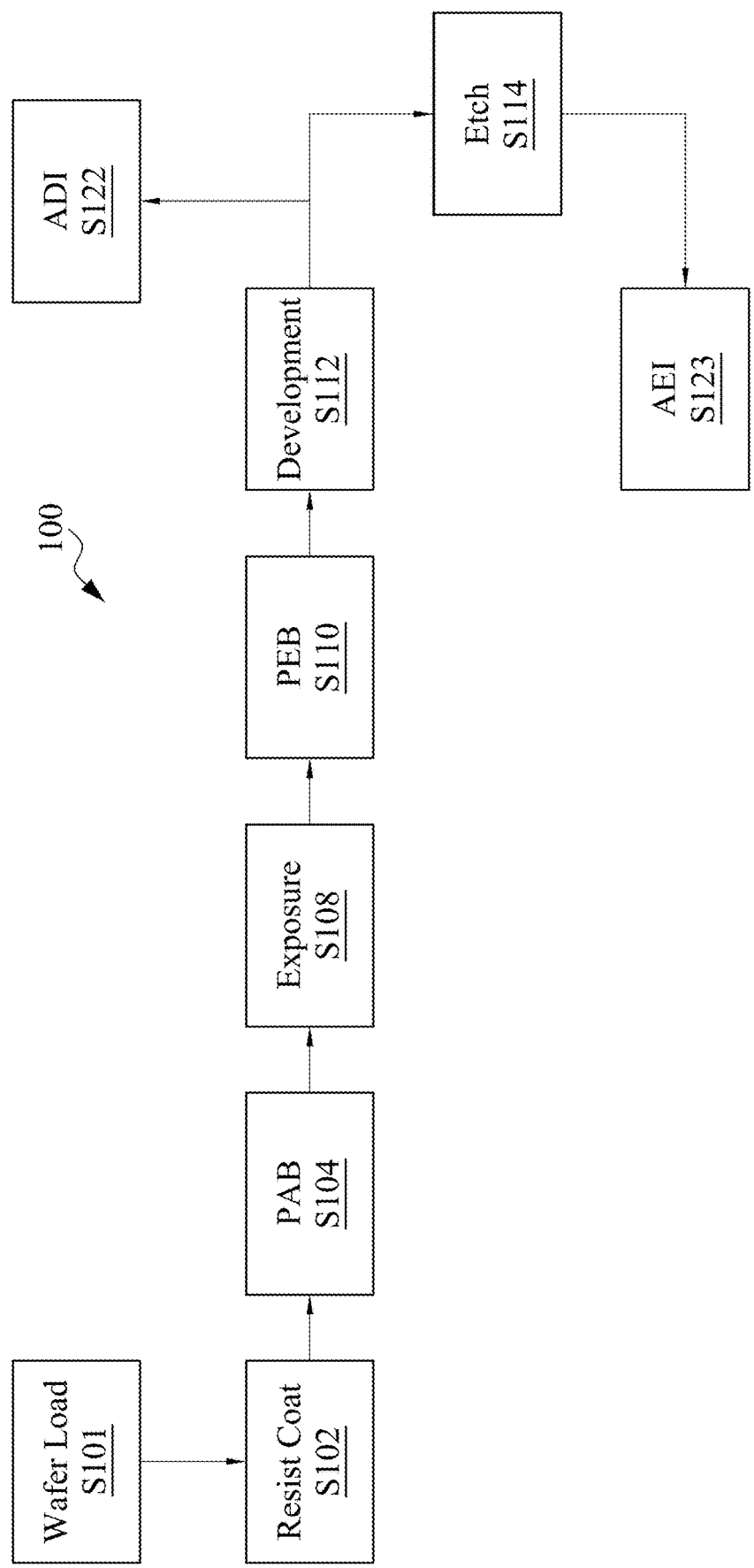
FIGS. 1A and 1B show a process flow for generating an etched pattern on a semiconductor substrate and a process flow for development.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Remaining water residues and developed material residues on the developed photo resist pattern on the surface of the substrate, e.g., a wafer, may interfere with processes that occur after the photo resist development process. The remaining water residues and developed material residues may interfere with subsequent etching processes and cause a number of pinching and bridging in the connection lines or other patterns, e.g., a line collapse or a pattern collapse, in the developed resist pattern that is produced on the substrate. The remaining water residues and developed material residues on the developed resist pattern on the surface of the substrate can be reduced by spinning the substrate, in a spin drying operation at the end of the development process, to use the centrifuge force to move the remaining water residues and developed material residues farther from the center of the substrate to the edge of the substrate and cause the remaining water residues and developed material residues pushed off the edge of the substrate. If the spinning is not enough to remove all the remaining water residues and developed material residues from the surface and/or edge of the substrate, the remaining water residues and developed material residues can further be reduced by providing a gas flow, e.g., an air flow, that passes over the substrate during the spin drying operation. In some embodiments, by increasing the gas flow (e.g., by increasing the gas flow pressure) the remaining water residues and developed material residues are pushed further to the edge of the substrate and off the edge of the substrate such that and the water residues and developed material residues are essentially eliminated from the surface, e.g., top surface, of the substrate.

Figure 1B:
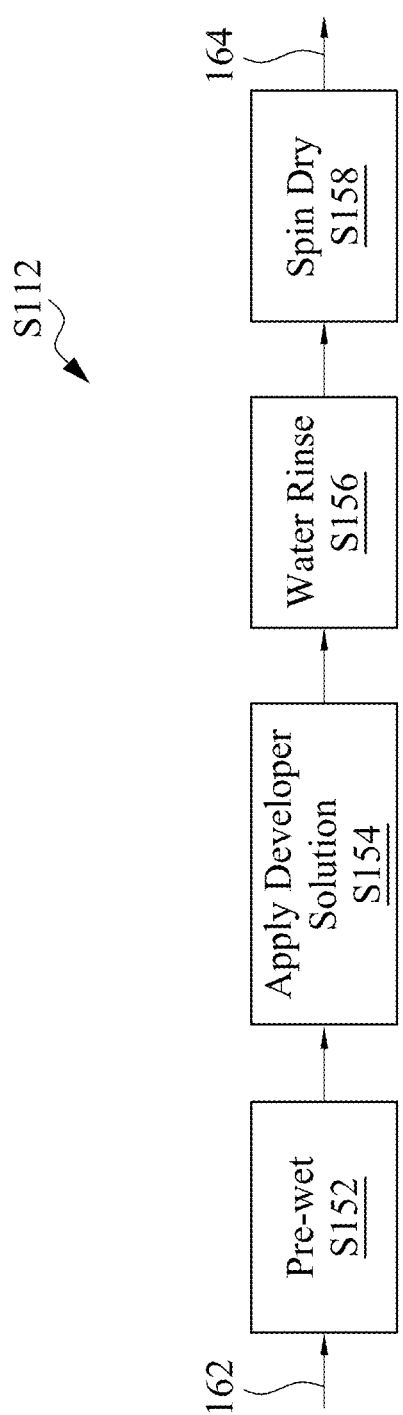
Figure 2:
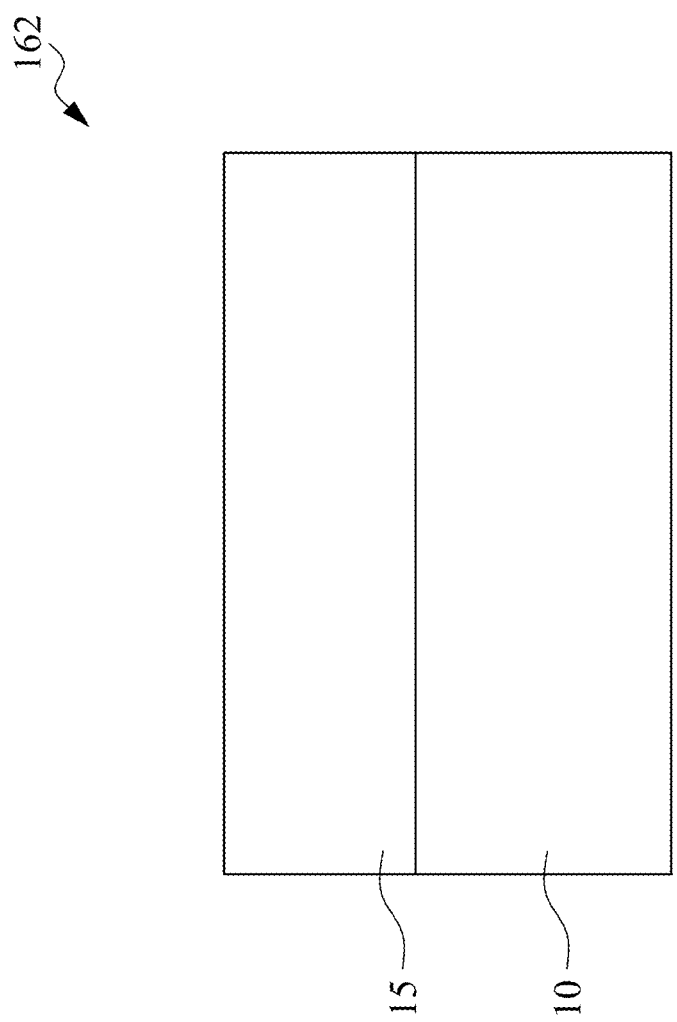
FIG. 2 shows a process stage of a sequential operation according to an embodiment of the disclosure.

FIGS. 1A and 1B show a process 100 for generating an etched pattern on a semiconductor substrate and a development operation S112, e.g., developing a resist pattern on the semiconductor substrate. In some embodiments, the process 100 is performed by a lithography system that is controlled by a control and/or computer system, e.g., a control system 700 of FIG. 11 and/or a computer system 900 of FIGS. 13A and 13B. In a wafer loading operation S101, a substrate, e.g., a semiconductor wafer, is loaded into a semiconductor device processing tool. In some embodiments, the tool is a coater-developer tool (not shown). In some embodiments in a resist coating operation S102, a photoresist layer 15 of a resist material is disposed, e.g., coated, on a top surface of a semiconductor substrate 10 shown in FIG. 2, e.g., the wafer or a work piece, to produce a photoresist-coated wafer. As shown in FIG. 2, the photoresist layer 15 is disposed over a semiconductor substrate 10, to provide a photoresist coated wafer 162. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, a thickness of the photoresist layer 15 ranges from about 10 nm to about 300 nm. At photoresist thicknesses below the disclosed range there may be insufficient photoresist coverage to protect the underlying substrate during subsequent etching operations. At photoresist thicknesses greater than the disclosed range, there may be excessive photoresist waste and longer processing time.

A pre-exposure (or post application bake (PAB)) is performed at a PAB operation S104 and the semiconductor substrate 10 including the photoresist layer 15 is baked to drive out solvent in the resist material and solidify the photoresist layer 15 on top of the semiconductor substrate 10. In some embodiments, the photoresist layer 15 is heated at a temperature of about 40° C. to about 120° C. for about 10 seconds to about 10 minutes during PAB operation S104. In the present disclosure, the terms resist and photoresist are used interchangeably. Selecting a PAB time and/or temperature below the above range may be insufficient for the removal of photoresist solvent the resist material. Selecting a PAB time and/or temperature greater than the above range, may increase energy costs and longer processing times.

Figure 3:
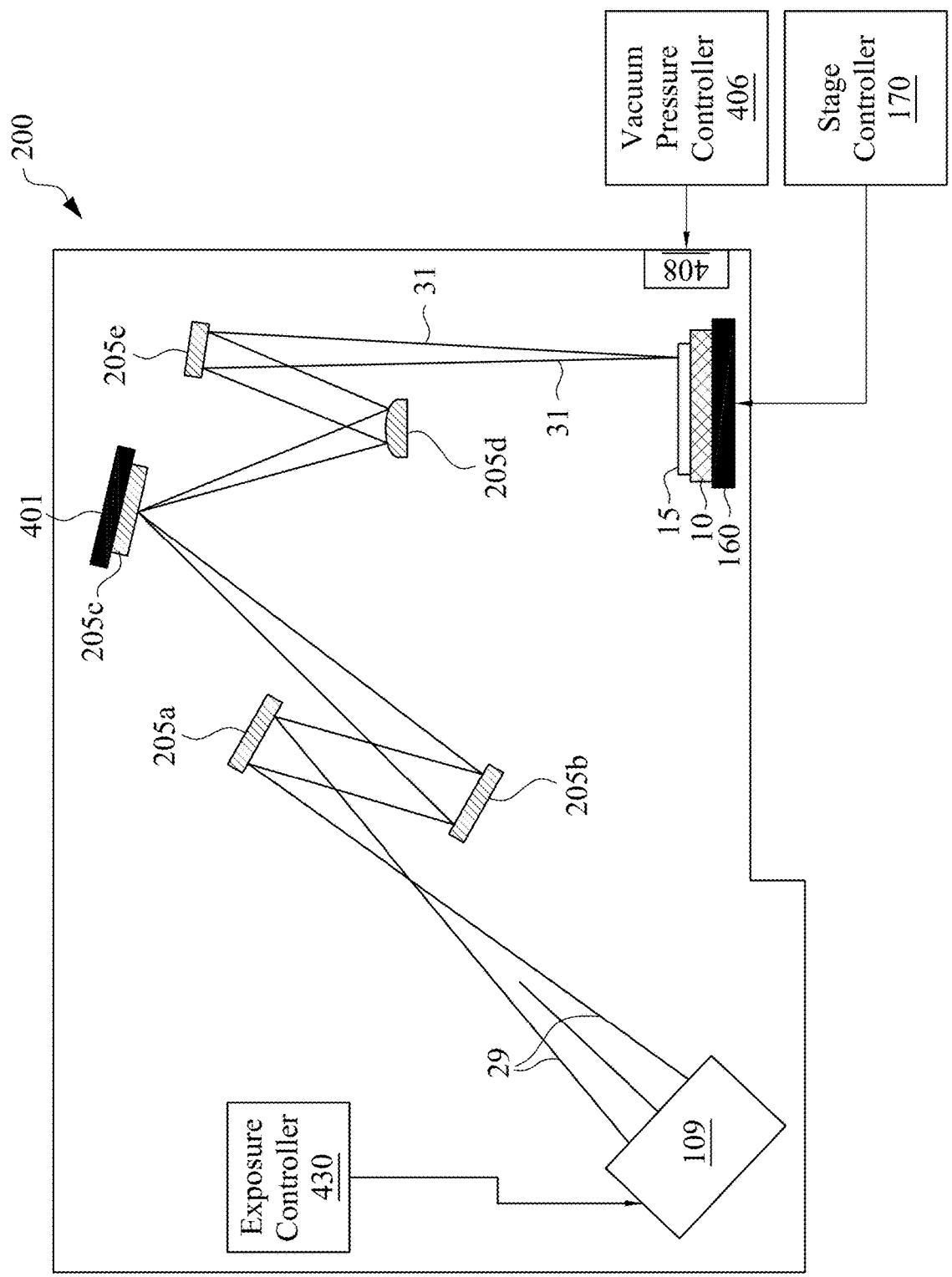
FIG. 3 shows a schematic view of an exposure device of a lithography system for generating a photo resist pattern on a wafer.

In an exposure operation S108, the photoresist-coated substrate is loaded into a photolithography tool 200, as shown in FIG. 3. The photoresist layer 15 is exposed to actinic radiation, in the photolithography tool 200. The exposure operation S108 also projects a layout pattern of a mask, e.g. a photomask 205c of FIG. 3, using the actinic radiation from the radiation source, onto the photoresist layer 15 on the semiconductor substrate 10. In some embodiments, the photoresist layer 15 is selectively exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the radiation is an electron beam. In the present disclosure, the terms mask, photomask, and reticle are used interchangeably.

In some embodiments, the photomask 205c is a reflective mask and the layout pattern on the mask is projected by extreme ultraviolet (EUV) radiation from an EUV light source 109 onto the photoresist layer 15 to generate a latent image in the photoresist layer 15 on the semiconductor substrate 10.

A post exposure bake (PEB) is performed at a PEB operation S110 on the substrate where the resist layer is further baked after being exposed to the actinic radiation and before being developed in the development operation S112. In some embodiments, the photoresist layer 15 is heated to a temperature of about 50° C. to about 160° C. for about 20 seconds to about 10 minutes. In some embodiments, the photoresist layer 15 is heated for about 30 seconds to about 5 minutes. In some embodiments, the photoresist layer 15 is heated for about 1 minute to about 2 minutes. The post-exposure baking may be used to assist in the generating, dispersing, and reacting of acid/base/free radical generated from the impingement of the actinic radiation upon the photoresist layer 15 during the exposure. Such assistance helps to create or enhance chemical reactions that generate chemical differences between the exposed region and the unexposed region within the photoresist layer. These chemical differences also cause differences in the solubility between the exposed region and the unexposed region. At PEB times and temperatures below the disclosed ranges there may be insufficient generation, dispersion, and reaction of the chemical reactants in the exposed region of the photoresist layer. At PEB times and temperatures greater than the disclosed ranges, there may be increased energy costs and longer processing times, and thermal degradation of the photoresist layer.

Figure 5:
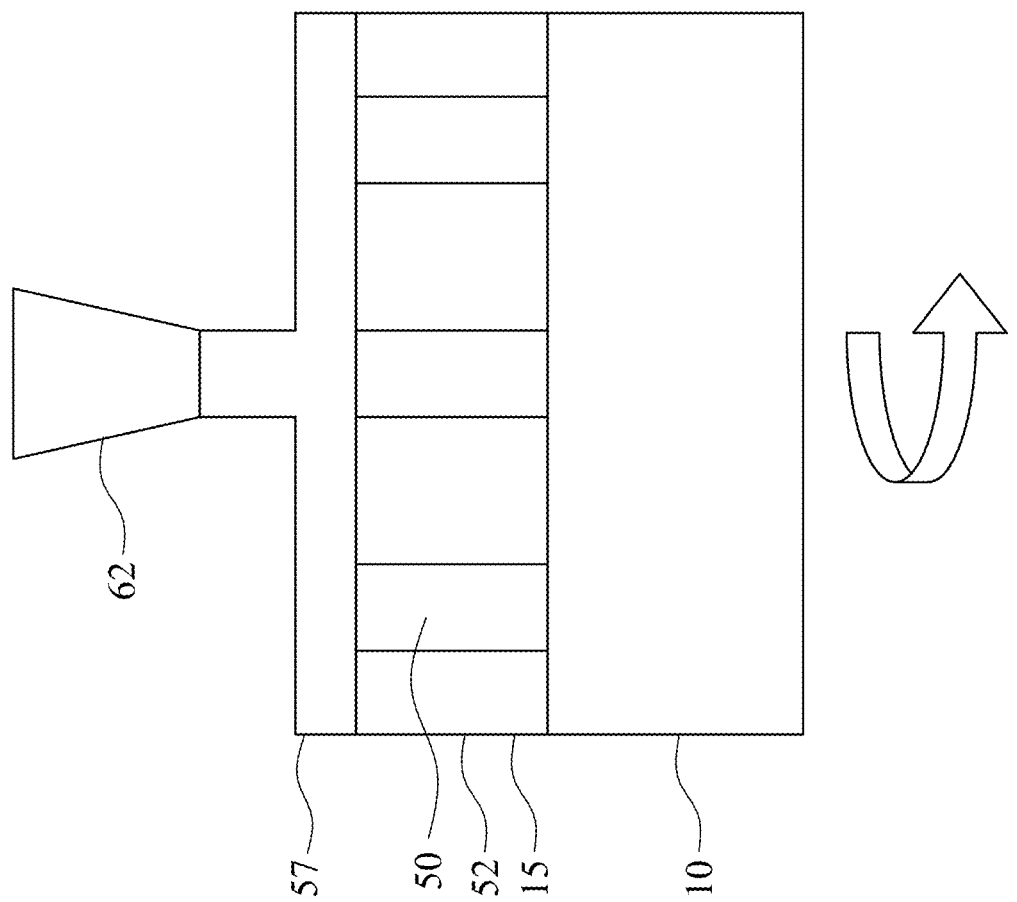
FIG. 5 shows a process stage of a sequential operation according to an embodiment of the disclosure.
Figure 6B:
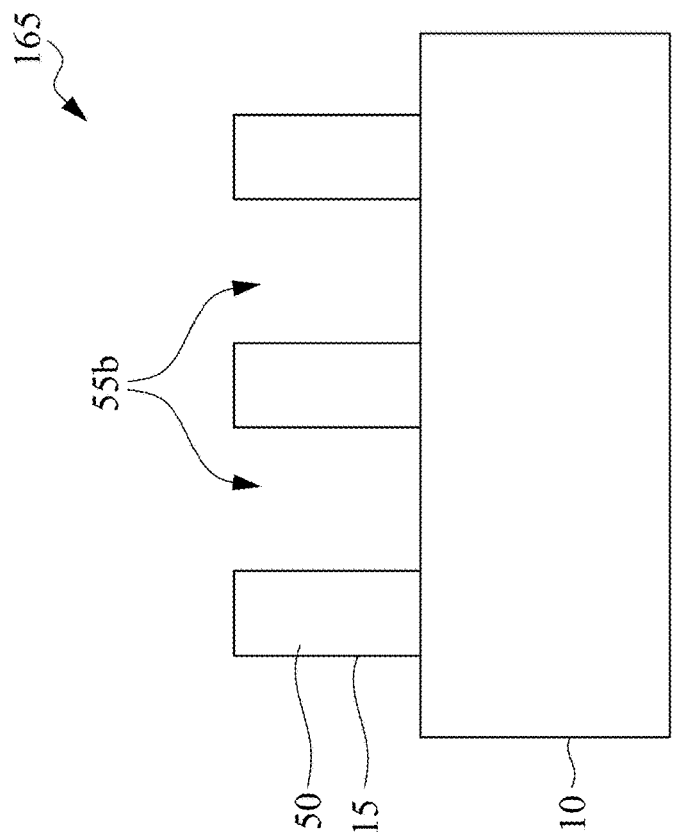
FIGS. 6A and 6B show a process stage of a sequential operation according to an embodiment of the disclosure.
Figure 6A:
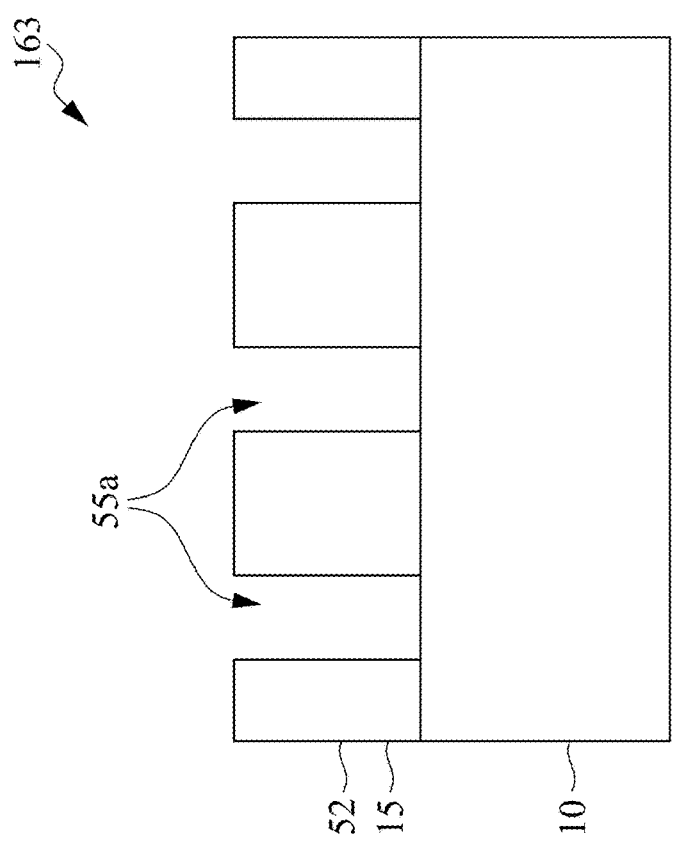

The selectively exposed photoresist layer is subsequently developed by applying a developer to the selectively exposed photoresist layer in operation S112. As shown in FIG. 5, a development material 57, e.g., a developer, is supplied from a nozzle 62 to the photoresist layer 15. In some embodiments, the exposed region 50 of the photoresist layer radiation is removed by the development material 57 forming a pattern of openings 55a in the photoresist layer 15 to expose the semiconductor substrate 10, as shown in FIG. 6A to produce the patterned semiconductor substrate 163. In other embodiments, the unexposed region 52 of the photoresist layer is removed by the development material 57 forming a pattern of openings 55b in the photoresist layer 15 to expose the semiconductor substrate 10, as shown in FIG. 6B to produce the patterned semiconductor substrate 165.

In some embodiments, the development material 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer. At chemical component concentrations below the disclosed range there may be insufficient development. At chemical component concentrations greater than the disclosed range, there may be overdevelopment and waste of materials.

In some embodiments, the development material 57 is applied to the photoresist layer 15 using a spin-on coating process. In the spin-on coating process, the development material 57 is applied to the photoresist layer 15 from above the photoresist layer 15 while the photoresist-coated substrate is rotated, as shown in FIG. 5. In some embodiments, the development material 57 is supplied at a rate of between about 5 ml/min and about 800 ml/min, while the photoresist coated semiconductor substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments. At spin rates, times, and temperatures below the disclosed range there may be insufficient development. At spin rates, times, and temperatures greater than the disclosed range, there may be degradation of the resist pattern.

While the spin-on coating process is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

FIG. 1B shows the operation S112 for development. In some embodiments, the operation S112 is performed by a resist development system, e.g., a development system 800 of FIG. 8A, that is controlled by the control system 700 of FIG. 11 and/or the computer system 900 of FIGS. 13A and 13B. In a pre-wet operation S152, the photoresist-coated wafer 162 loaded on a stage is rinsed such that the photoresist layer 15 on the semiconductor substrate 10 that is loaded on a stage of a development system is rinsed with water, e.g., de-ionized (DI) water. A development system 800 is described with respect to FIG. 8A. In an apply developer solution operation S154, as shown in FIG. 5, a development material 57 is applied, via a nozzle 62, to the photoresist material on the surface of the semiconductor substrate 10. The development material 57 is applied when the semiconductor substrate 10 is on a stage 825, e.g., a rotatable wafer stage, of the development system 800. In a water rinse operation S156, the developed material e.g., the photoresist developed material, on the surface of the semiconductor substrate 10 is rinsed with water, e.g., DI water to produce a resist pattern on the surface of the semiconductor substrate 10. In some embodiment, after the water rinse operation S156 some water residues and developed material residues remain on the surface of the semiconductor substrate 10. In a spin dry operation S158, the substrate is rotated on the stage such that the centrifuge force moves the remaining water residues and developed material residues on the semiconductor substrate 10 farther from the center of the semiconductor substrate 10 to the edge of the semiconductor substrate 10 and cause part of the remaining water residues and developed material residues to be pushed off from the edge of the substrate and, thus, reducing the remaining water residues and developed material residues on the surface of the semiconductor substrate 10. After the spin dry operation S158, a wafer 164 with the developed resist pattern is sent for the next process. In some embodiments, during the spin dry operation S158, the substrate is rotated at a speed between about 100 rpm and about 3000 rpm.

FIG. 3 shows a schematic view of a photolithography tool 200 for generating a resist pattern on a wafer. In some embodiments, the photolithography tool 200 is an extreme ultraviolet (EUV) lithography tool, where the photoresist layer 15 is exposed by a patterned beam 31 of EUV radiation. A chamber of the photolithography tool 200 may include a wafer movement device, e.g., a stage 160, a stepper, a scanner, a step and scan system, a direct write system, a device using a contact and/or proximity mask, etc. The tool is provided with one or more optics 205a, 205b, for example, to illuminate a patterning optics, such as a reticle, e.g., a reflective mask 205c with a radiation beam 29, e.g., an EUV radiation beam in some embodiments. The illumination of the patterning optics may produce a patterned beam 31. One or more reduction projection optics 205d, 205e, of the optical system projects the patterned beam 31 onto a photoresist layer 15 of the semiconductor substrate 10. A stage controller 170 may be coupled to the wafer movement device, e.g., the stage 160, for generating a controlled relative movement between the semiconductor substrate 10 and the patterning optics, e.g., the reflective mask 205c. By the controlled relative movement, different dice of the semiconductor substrate 10 are patterned. In some embodiments, the reflective mask 205c is mounted on a reticle stage 401, e.g., a mask stage.

As further shown, the photolithography tool 200 of FIG. 3 includes a radiation source 109 to generate the radiation beam 29 used to irradiate the reflective mask 205c. Because gas molecules absorb EUV light, the photolithography tool 200 is maintained under a vacuum environment to avoid EUV intensity loss. In addition, in some embodiments, the photolithography tool 200 includes an exposure controller 430 to control an intensity of the radiation beam 29. In some embodiments, the exposure controller 430 adjusts the intensity of the radiation by adjusting a projection time of the lithography operation to pattern the resist layer. In some embodiments, a pressure inside the photolithography tool 200 is sensed by a pressure sensor 408 inside the photolithography tool 200 and is controlled by a vacuum pressure controller 406 that is coupled to the photolithography tool 200.

Figure 4A:
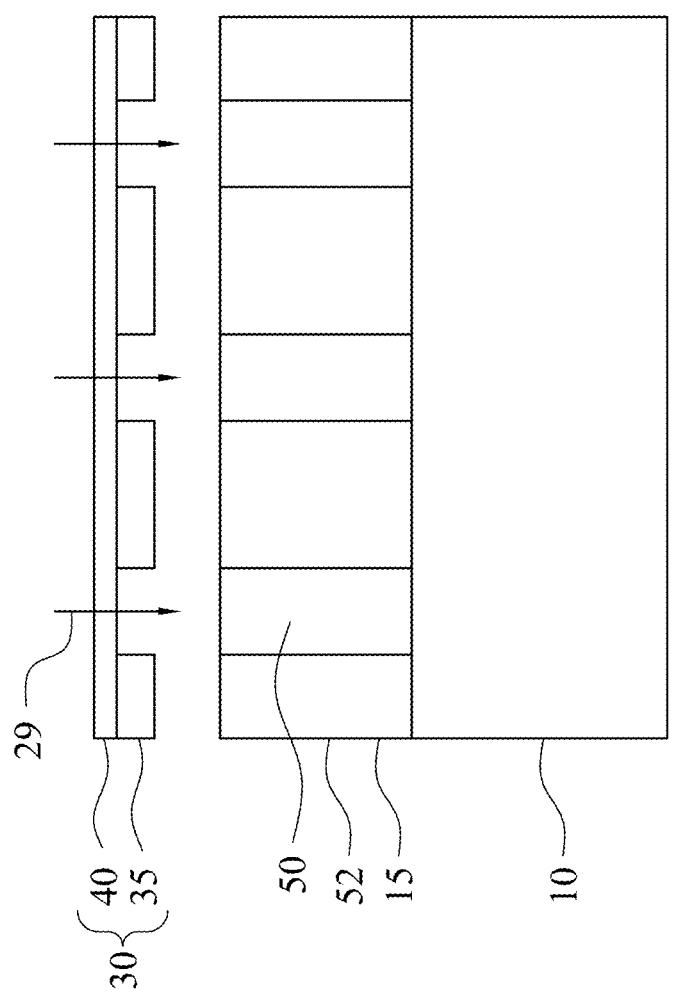
FIGS. 4A and 4B show a process stage of a sequential operation according to an embodiment of the disclosure.

As shown in FIG. 4A, the exposure radiation beam 29 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 4B:
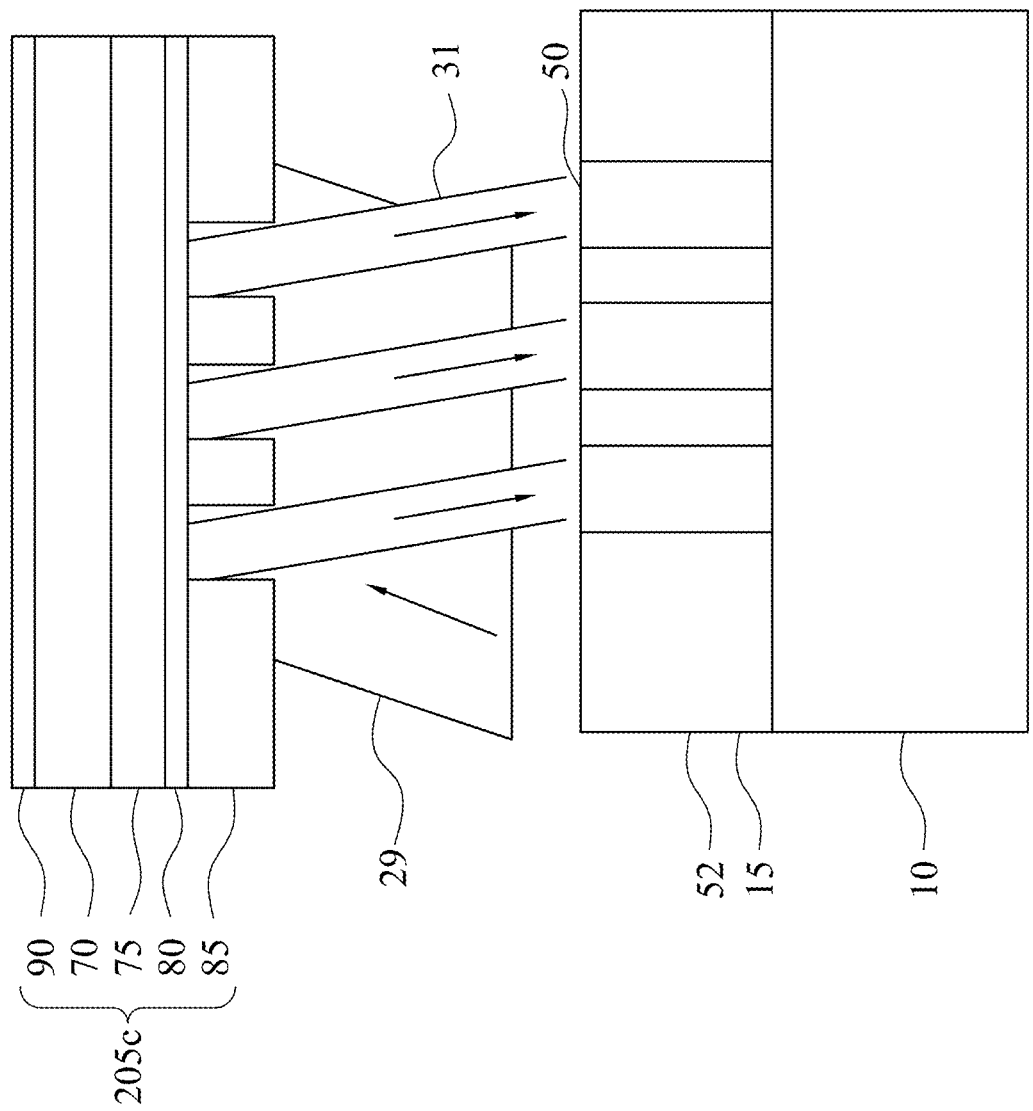

In some embodiments, where the exposure radiation is EUV radiation, the reflective photomask 205c is used to form the patterned exposure light, as shown in FIG. 4B. In some embodiments, the exposure is performed in the photolithography tool 200. The reflective photomask 205c includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion glass substrate 70. In extreme ultraviolet lithography, extreme ultraviolet radiation beam 29 is directed towards the reflective photomask 205c at an incident angle of about 6°. A portion 31 of the EUV radiation is reflected by the Si/Mo multilayer 75 towards the photoresist-coated semiconductor substrate 10, while the portion of the extreme ultraviolet radiation incident upon the absorber layer 85 is absorbed by the photomask. In some embodiments, additional optics, including mirrors, are between the reflective photomask 205c and the photoresist-coated substrate.

The exposed region 50 of the photoresist layer to radiation undergoes a chemical reaction thereby changing its solubility in a subsequently applied developer relative to the unexposed region 52 of the photoresist layer to radiation. In some embodiments, the exposed region 50 of the photoresist layer to radiation undergoes a reaction making the exposed portion more soluble in a developer. In other embodiments, the exposed region 50 of the photoresist layer to radiation undergoes a crosslinking reaction making the exposed portion less soluble in a developer.

In some embodiments, the actinic radiation beam 29, includes g-line (wavelength of about 436 nm), i-line (wavelength of about 365 nm), ultraviolet radiation, far ultraviolet radiation, extreme ultraviolet, electron beam, or the like. In some embodiments, the radiation source 109 is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm). In some embodiments, the exposure of the photoresist layer 15 uses an immersion lithography technique. In such a technique, an immersion medium is placed between the final optics and the photoresist layer, and the exposure radiation passes through the immersion medium.

Figure 7E:
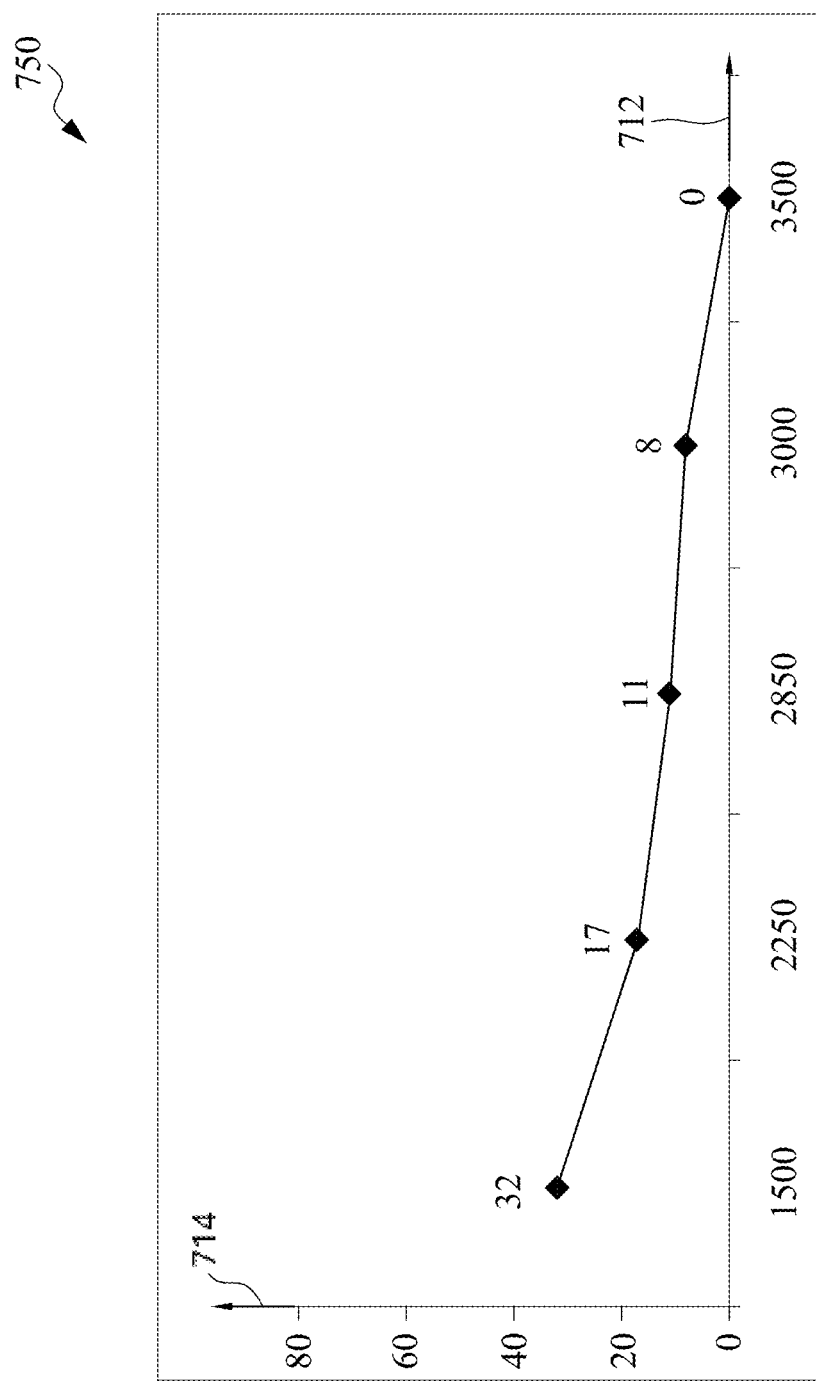

FIGS. 7A, 7B, 7C, 7D, and 7E show a system for generating a resist pattern and/or an etched pattern on the substrate, developed material residues and water residues on the substrate, a defect caused by the residues in an etched pattern on the substrate, and a graph of the number of pattern collapses on a wafer vs. the spin drying speed. FIG. 7A shows a system 300 for performing the apply developer solution operation S154 and the water rinsing operation S156 of the substrate 220, where the substrate 220 is consistent with the semiconductor substrate 163 or 165. As described with respect to FIG. 5, before the water rinsing operation S156, a development material, consistent with the development material 57, is applied in an apply developer solution operation S154 to the surface of the substrate 220 through a nozzle (not shown in FIG. 7A), consistent with the nozzle 62 in FIG. 5. In the water rinsing operation S156 of the substrate 220, the developed material 212 that may include deionized (DI) water is moved in a direction 214 to the edges of the substrate 220 by centrifugal force caused by rotation 255 of the substrate 220. In some embodiments, as shown in FIG. 7B, the centrifugal force is not strong enough to remove all of the developed material from the top surface of the substrate 220 and developed material residues 224 that may include DI water remain on the top surface of the substrate 220. In some embodiments, the developed material residues 224 are clustered in a central region 222 of the top surface of the substrate 220 but an edge region 226 of the top surface of the substrate 220 is essentially free of the development material. In some embodiments, as shown in FIG. 7A, the back side of the substrate 220 is cleaned by DI water 210 that is delivered through the nozzles 208 tilted at an acute angle relative to the back side surface of the substrate 220. In some embodiments, cleaning the back side of the substrate 220 causes the DI water 210 to splash, e.g., climb, over the edges of the substrate 220 and even get to the edge region 226 of the substrate 220. The climbed over DI water may generate a barrier force in a direction 216 that blocks the developed material 206 from leaving the edge region 226 and generate developed material residues 228 that may include DI water that splashes to the edge region 226 of the top surface of the substrate 220. FIG. 7D shows defects 232 and 234 generated after a subsequent etching operation in an etched pattern 230 because some of the developed material 206 or 212 remaining on the top surface of the substrate 220. As described above, the centrifugal force caused by the rotation 255 of the substrate 220 may remove the developed material 206 or 212 from the top surface of the substrate 220. In some embodiments, a strength of the centrifugal force depends on the velocity of the rotation 255 and rotating the substrate 220 faster generates a stronger centrifugal force that removes more developed material 206 or 212 from the top surface of the substrate 220 and generates less number of defects after the subsequent etching operation in the etched pattern 230. In some embodiments, the etched pattern 230 is used for generating connection lines and the defects 232 and 234 are line collapses, e.g., pattern collapses.

As described with respect to FIG. 1B, after the water rinsing operation S156, the spin dry operation S158 is applied to the substrate 220. During the spin dry operation S158 the substrate is rotated by the rotation 255 while no water is applied to the top surface or back side of the substrate 220. Thus, during the spin dry operation S158, there is no barrier force in the direction 216 that blocks the developed material 206 from leaving the edge region 226. Thus, during the spin dry operation S158, increasing the angular velocity of the rotation 255 may increase the centrifugal force caused by the rotation 255 of the substrate 220 may remove more developed material 206 or 212 from the top surface of the substrate 220. FIG. 7E shows a graph 750 of the number of line collapses, e.g., defects 232 or 234, in the etched test pattern on a wafer, on a coordinate 714, vs. the angular velocity of the rotation 255, on a coordinate 712. In some embodiments, the coordinate 712 shows the number of rotations per minute. As shown in FIG. 7E, when the angular velocity of the rotation 255 changes from 1500 rotations per minute (rpm) to 3500 rpm, the number of line collapses, e.g., defects 232 and 234 in the etched pattern on the wafer changes from 32 to zero. In some embodiments, the spin dry operation S158 is performed for between about 0.1 seconds and 5 seconds. In some embodiments the spin dry operation S158 is performed for between about 5 seconds and 15 seconds. In some embodiments, the rotation 255 of the substrate 220 is set between about 100 cycles per minute to about 1500 cycles per minute.

Figure 8D:
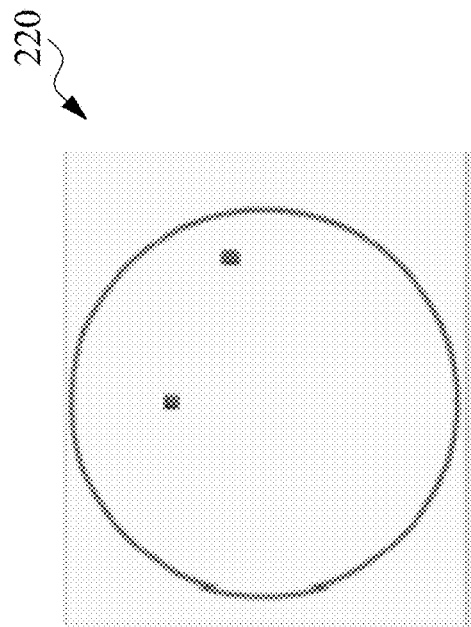

FIGS. 8A, 8B, 8C, 8D, 8E, 8F, and 8G show a system for generating a resist pattern and/or an etched pattern on the substrate, an exhaust control system of the system for generating the resist pattern and/or the etched pattern on the substrate, and developed material residues and water residues with and without using the exhaust control system in accordance with some embodiments of the present disclosure. FIG. 8A shows a photoresist development system 800 for developing the photoresist layer of the substrate 220 and rising the substrate 220 after the photoresist development. The photoresist development system 800 shows a gas blower system 810 and a linear nozzle 811 coupled to an enclosure 855 of the photoresist development system 800. The linear nozzle 811, through the gas blower system 810 and pipe 804, is coupled to a gas source 816. The gas source 816 is coupled to a developer controller 822 that generates and controls the flow of fan shape stream of gas 833. The fan shape stream of gas 833 enters the enclosure 855 of the photoresist development system 800. In some embodiments, at least a portion of the fan shape stream of gas 833 enters a development chamber 805 inside the enclosure 855 through an opening 832 of the development chamber 805. The development chamber 805 shows a stage 825, e.g., a rotatable wafer stage, and a wafer 830, e.g., a photoresist-coated wafer, loaded on the stage 825 and standing on stage pins 856. In some embodiments, the stage 825 rotates around an axis 854 with the rotation 255.

The development chamber 805 is connected via at least a cup 852 below the stage 825 to a gas transfer chamber 809. In some embodiments, the cup 852 is formed with the shape of a hollow ring, e.g., a hollow cylinder 857 connected to a bottom of the development chamber 805 with another cylinder 853 inside hollow cylinder 857. The cylinder 853 may be concentric with the hollow cylinder 857 and may be hollow or solid. In some embodiments, the axis 854 is mounted on top of the cylinder 853. The portion of the fan shape stream of gas 833, a purge gas, that enters the development chamber 805 and blows over the wafer 830, goes down from the edge of the wafer 830 along a length of the axis 854, and flows through the cup 852 (having a width 851, e.g., the width of the hollow ring) to the gas transfer chamber 809. In some embodiments, the flow rate of the fan shape stream of gas 833 that is controlled by the developer controller 822, which determines the flow rates of the streams of the gas that blow over the wafer 830 and the stream of gas 836 that flow through the cups 852 to the gas transfer chamber 809. The photoresist development system 800 also shows an exhaust system 820 that connects the gas transfer chamber 809 to an exhaust gas port 850 of the photoresist development system 800. A stream of gas 846 leaves the gas transfer chamber 809 through a first entrance port 865 of the exhaust system 820 and enters the exhaust system 820.

A remaining portion of the fan shape stream of gas 833 that does not enter the development chamber 805 passes through the enclosure 855 and via a second entrance port 835 of the exhaust system 820 enters as a stream of gas 866 to the exhaust system 820. The combination of the stream of gas 866 and the stream of gas 846 generates an exhaust stream of gas 834 that leaves the photoresist development system 800 through the exhaust gas port 850. In some embodiments, the linear nozzle 811 blows the purge gas over the wafer 830 to the gas transfer chamber 809 that eventually exits the exhaust gas port 850. As described, blowing the fan shape stream of gas 833 may add to the centrifugal force caused by the rotation 255 of the substrate 220 and move more developed material residues 224 or 228 from the top surface of the substrate 220 and generates less number of defects after the subsequent etching operation in the etched pattern 230. In some embodiments, after the apply developer solution operation S154, the developed material 212 that includes dissolved photoresist is spread on the surface of the substrate 220 and the DI water in the water rinsing operation S156 removes the dissolved photoresist from the surface of the substrate 220. As described above, the water rinsing operation S156 may not sufficiently clean the surface of the substrate 220 and some developed material residues and water residues remain on the surface of the substrate 220.

In some embodiments, the flow rates of the stream of gas 846, which is the flow rate of the stream of gas 836 that pass through the cup 852, is the flow rate that passes over the wafer 830 and is the flow rate that goes through the development chamber 805 and exits the gas transfer chamber 809 via the first entrance port 865 of the exhaust system 820. Thus, the flow rate of the stream of gas 846 is an exit flow rate of the development chamber 805, e.g., a wafer flow rate, which is a flow rate passing over the wafer, in the development chamber 805. In some embodiments, as described with respect to FIG. 5, in the development chamber 805, before the water rinsing operation S156, a development material, consistent with the development material 57, is applied in an apply developer solution operation S154 to the to surface of the substrate 220 through a nozzle (not shown), consistent with the nozzle 62. In some embodiments, the developer controller 822 is coupled to the stage 825 for controlling a spin rate of the stage 825. In some embodiments, the developer controller 822 includes the stage controller 170.

In some embodiments, the developer controller 822 controls the flow rate of the fan shape stream of gas 833 exiting the linear nozzle 811 through controlling a pressure of the gas exiting the linear nozzle 811. As shown in FIG. 8A, the developer controller 822 is also coupled to the exhaust system 820 and by controlling the exhaust system 820 controls the flow rate of the exhaust stream of gas 834 exiting the exhaust gas port 850.

In some embodiments, the developed materials 212 or 206 include development material 57 and dissolved photoresist, and are spread on the substrate 220. A purge gas is projected by the fan shape stream of gas 833 to the surface of the substrate 220. In some embodiments, the purge gas is one or more gases selected from the group consisting of clean dry air, nitrogen, argon, helium, neon, and carbon dioxide. In some embodiments, the purge gas has less than about 1 ppb impurities and less than about 1% relative humidity.

FIGS. 8B and 8C show the exhaust system 820. The exhaust system 820 of FIGS. 8B and 8C includes the first entrance port 865 and the second entrance port 835. The stream of gas 846 enters the exhaust system 820 through the first entrance port 865 and the stream of gas 866 enters the exhaust system 820 through the second entrance port 835. The exhaust system 820 of FIGS. 8B and 8C includes the exhaust gas port 850 where the exhaust stream of gas 834, a combination of the streams of gas 866 and 846, leaves the exhaust system 820 through the exhaust gas port 850. As shown in FIG. 8B, the exhaust system 820 includes a hinged shutter 845 (e.g., a damper) that rotates around a hinge 840 in an angular direction 849. A shutter controller 815 is coupled to and controls the hinged shutter 845. By rotating the hinged shutter 845, an angle T of the shutter with the horizontal direction changes and openings of the first and second entrance ports 865 and 835 are modified and the streams of gas 846 and 866 are adjusted. In some embodiments, the hinged shutter 845 is rotated, the angle T becomes zero, the second entrance port 835 becomes closed, and the stream of gas 866 becomes zero, e.g., does not exist, and all the fan shape stream of gas 833 passes through the development chamber 805, the cup 852, and the gas transfer chamber 809 to the exhaust system 820.

In some embodiments, as the angle T increases, the second entrance port 835 becomes more open and the first entrance port 865 becomes less open. Thus, the flow rate of the stream of gas 846 is reduced and the flow rate of the stream of gas 866 is increased. In some embodiments, when the second entrance port 835 is closed, the pressure and the flow rate of the stream of gas 836, 846, or 834 is determined by the width 851 of the cup 852 and the pressure and the flow rate of the fan shape stream of gas 833. In some embodiments, when the second entrance port 835 is partially or completely open, the pressure and the flow rate of the stream of gas 836 is determined by the width 851 of the cup 852, the pressure and the flow rate of the fan shape stream of gas 833, an amount of opening of the second entrance port 835, e.g., the angle T of the hinged shutter 845.

As shown in FIG. 8C, in some embodiments, the exhaust system 820 includes a sliding shutter 844 that moves over ball bearings 842 in a horizontal direction 847. The shutter controller 815 is coupled to and controls the sliding shutter 844. By moving the sliding shutter 844, an opening size of the second entrance port 835 is modified and the streams of gas 846 and 866 are adjusted. In some embodiments, the sliding shutter 844 is moved such that the second entrance port 835 becomes closed, and the stream of gas 866 becomes zero, e.g., does not exist, and all the fan shape stream of gas 833 passes through the development chamber 805, the cup 852, and the gas transfer chamber 809 to the exhaust system 820. As shown in FIG. 8A, the developer controller 822 is coupled to the shutter controller 815 of exhaust system 820 and controls the flow rate of the streams of gas 833, 836, 846, and 834. In some embodiments, the flow rate of the stream of gas 846 (the exit flow rate) is proportional to the flow rate of the fan shape stream of gas 833. In some embodiments, the flow rate of the stream of the exhaust stream of gas 834 is proportional to the flow rate of the fan shape stream of gas 833. In some embodiments, the flow rate of the stream of gas 866 is proportional to the flow rate of the fan shape stream of gas 833. In some embodiments, when the hinged shutter 845 or the sliding shutter 844 closes the second entrance port 835, the flow rate of the stream of gas 866 is reduced and the flow rate of the stream of gas 846 is increased.

In some embodiments, the opening size of the second entrance port 835 is reduced, the flow rate of the stream of gas 866 is reduced and the flow rate of the streams of gas 846 is increased. In some embodiments, the opening size of the second entrance port 835 is increased, the flow rate of the stream of gas 866 is increased and the flow rate of the streams of gas 846 is reduced. In some embodiments, the sliding shutter 844 is moved such that the second entrance port 835 becomes closed and the stream of gas 866 becomes zero, e.g., does not exist, and all the fan shape stream of gas 833 passes through the development chamber 805, the cup 852, and the gas transfer chamber 809 to the exhaust system 820.

In some embodiments, as the sliding shutter 844 moves to the right (opposite to the direction 847), the second entrance port 835 becomes more open. Thus, the flow rate of the stream of gas 846 is reduced and the flow rate of the stream of gas 866 is increased and vice versa. In some embodiments, when the second entrance port 835 is closed, the pressure and the flow rate of the stream of gas 836, 846, or 834 is determined by the width 851 of the cup 852 and the pressure and the flow rate of the fan shape stream of gas 833. In some embodiments, when the second entrance port 835 is partially or completely open, the pressure and the flow rate of the stream of gas 836 is determined by the width 851 of the cup 852, the pressure and the flow rate of the fan shape stream of gas 833, an amount of opening of the second entrance port 835, e.g., where the sliding shutter 844 is placed.

In some embodiments, a flow rate of the fan shape stream of gas 833, e.g., the purge gas, during the applying the purge gas ranges from about 50 cc/s to about 2000 cc/s. In some embodiments, a flow rate of the purge gas during the applying the purge gas ranges from about 100 cc/s to about 1000 cc/s. In other embodiments, a flow rate of the purge gas during the applying a purge gas ranges from about 150 cc/s to about 500 cc/s. In some embodiments, the purge gas is applied to the substrate during the spin dry operation S158 for about 10 seconds to about 20 minutes. In some embodiments, the purge gas is applied to the substrate for about 30 seconds to about 10 minutes. In some embodiments, the purge gas is applied to the substrate for about 1 minute to about 5 minutes. In some embodiments, the purge gas flow rate is varied (e.g., decreasing) during the applying the purge gas. For example, in some embodiments, a purge gas flow rate of about 200 cc/s is applied to the wafer for about 1 minute and then a purge gas flow rate of about 100 cc/s is applied for about 10 minutes. In another embodiment, a purge gas flow rate of about 1000 cc/s is applied for about 1 minute and then a purge gas flow rate of about 100 cc/s is applied for about 1 minute. In another embodiment, a purge gas flow rate of about 200 cc/s is applied for about 5 minutes and then a purge gas flow rate of about 100 cc/s is applied for about 5 minutes. At purge gas flow rates and purge gas flow times below the disclosed ranges, there may be insufficient removal of the residues. At purge gas flow rates and purge gas flow times greater than the disclosed ranges, there may be increased manufacturing costs with no significant improvement in the defect rate or device performance.

In some embodiments, the pre-wet operation S152, is performed under a medium pressure gas flow setting of the development chamber 805 such that the developer controller 822 sets the exit flow rate of the stream of gas 846 of the development chamber 805 and the gas transfer chamber 809 to a medium flow rate of between about 150 cc/s and about 250 cc/s, e.g., about 200 cc/s, and the gas pressure of the development chamber 805 and the gas transfer chamber 809 is set to a medium pressure of between about 45 kilo Pascal (kPa) and about 65 kPa, e.g., about 55 kPa. Also, in some embodiments, the apply developer solution operation S154 and the water rinse operation S156, are performed under the medium pressure gas flow setting in the development chamber 805 of the photoresist development system 800. In some embodiments, the spin dry operation S158, is performed under a high pressure gas flow setting such that the developer controller 822 sets the exit flow rate of the stream of gas 846 of the development chamber 805 and the gas transfer chamber 809 to a high flow rate of between about 800 cc/s and about 1200 cc/s, e.g., about 1000 cc/s. In addition, the development chamber 805 and the gas transfer chamber 809 may have a high pressure, e.g., a pressure of the development chamber 805 and the gas transfer chamber 809 is set to a high pressure between about 120 kPa and about 160 kPa, e.g., about 140 kPa. In some embodiments, before loading the wafer 830 to the stage 825, the development chamber 805 is set to a low pressure gas flow setting such that the developer controller 822 sets the exit flow rate of the stream of gas 846 of the development chamber 805 and the gas transfer chamber 809 to a low flow rate of between about 15 cc/s and about 25 cc/s, e.g., about 20 cc/s, and the development chamber 805 and the gas transfer chamber 809 are set to a low pressure of between about 4 kPa and about 6 kPa, e.g., about 5 kPa. In some embodiments, the developed material residues and water residues are drastically reduced when the spin dry operation S158 is performed under the high pressure gas flow setting. In some embodiments, during the spin drying, the developer controller 822 modifies the exit flow rate of the stream of gas 846 of the development chamber 805 and the gas transfer chamber 809 between about 800 cc/s and about 1200 cc/s. In some embodiments, the developer controller 822 modifies the pressure of the development chamber 805 between about 120 kPa and about 160 kPa. In some embodiments, the developer controller 822 periodically alternates, e.g., between every 10 seconds to 2 minutes, the exit flow rate of the stream of gas 846 of the development chamber 805 and the gas transfer chamber 809 between about 800 cc/s and about 1200 cc/s. In some embodiments, the developer controller 822 periodically alternates, between every 10 seconds to 2 minutes, the pressure of the development chamber 805 between about 120 kPa and about 160 kPa.

In some embodiments, when the development chamber 805 (and the gas transfer chamber 809) is under the high pressure gas flow setting, the hinged shutter 845 is at zero degrees and the second entrance port 835 of the exhaust system 820 is closed. In some embodiments, when the development chamber 805 (and the gas transfer chamber 809) is under the low pressure gas flow setting, the hinged shutter 845 is at 90 degrees and the second entrance port 835 of the exhaust system 820 is completely open. In some embodiments, when the development chamber 805 (and the gas transfer chamber 809) is under the medium pressure gas flow setting, the angle T of the hinged shutter 845 is at about 25-35 degrees (e.g., about 30 degrees) and the second entrance port 835 of the exhaust system 820 is partially open.

In some embodiments, when the development chamber 805 (and the gas transfer chamber 809) is under the high pressure gas flow setting, the sliding shutter 844 is completely moved in the direction 847 and the second entrance port 835 of the exhaust system 820 is closed. In some embodiments, when the development chamber 805 (and the gas transfer chamber 809) is under the low pressure gas flow setting, the sliding shutter 844 is completely moved opposite to the direction 847 and the second entrance port 835 of the exhaust system 820 is completely open. In some embodiments, when the development chamber 805 (and the gas transfer chamber 809) is under the medium pressure gas flow setting, the sliding shutter 844 is at about half way between completely open and completely closed and the second entrance port 835 of the exhaust system 820 is partially open. In some embodiments, under the medium pressure gas flow setting, the second entrance port 835 is between about 40 percent and 60 percent open.

Figure 8E:
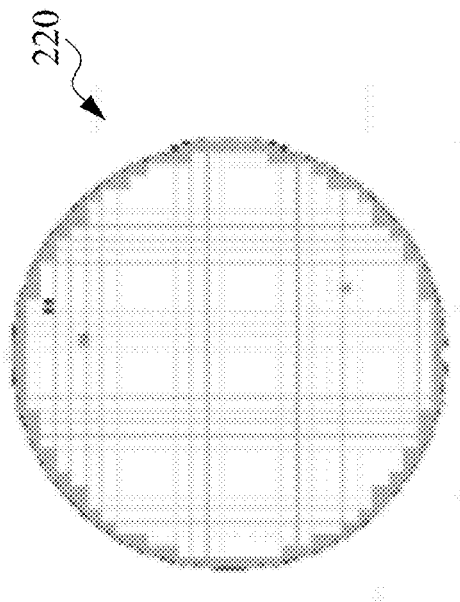
Figure 8F:
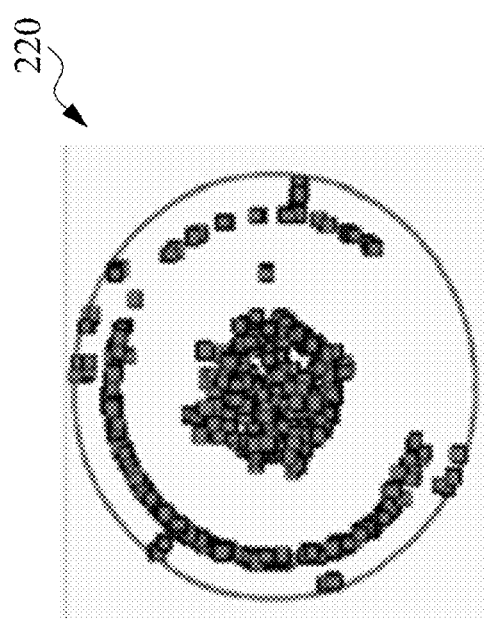
Figure 8G:
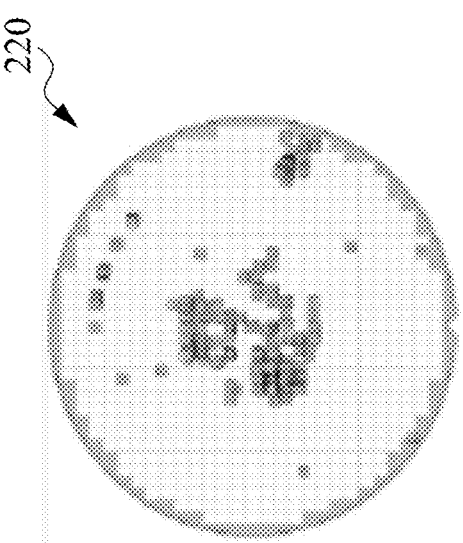

FIG. 8D shows a map of developed material residues on the surface of the substrate 220 when the back side of the substrate 220 is rinsed in FIG. 7A and the spin dry operation S158 is performed under the medium pressure gas flow setting. FIG. 8F shows a map of developed material residues on the surface of the substrate 220 for the same operation in FIG. 8D except that the spin dry operation S158 is performed under the high pressure gas flow setting. FIG. 8E shows a map of developed material residues and water residues on the surface of the substrate 220 when the spin dry operation S158 is performed under the medium pressure gas flow setting. FIG. 8G shows a map of developed material residues and water residues on the surface of the substrate 220 for the same operation in FIG. 8E except the spin dry operation S158 is performed under the high pressure gas flow setting. As shown, performing the spin dry operation S158 under the high pressure gas flow setting significantly reduces the developed material residues. In some embodiments when the angular velocity of the stage 825 is increased during the spin dry operation S158, the centrifugal force caused by the rotation 255 is increased and the developed material residues and water residues are decreased.

In some embodiments, after the spin dry operation S158, the substrate is etched in etching operation S114. In etching operation S114, the remaining resist material, the resist pattern, is used as a mask and the exposed regions of the substrate is etched to produce an etched pattern on the substrate. In some embodiments, the pattern of openings 55*a*, 55*b* in the photoresist layer 15 (see FIGS. 6A and 6B) are extended into the semiconductor substrate 10 to create a pattern of openings 55*a*', 55*b*' in the semiconductor substrate 10, thereby transferring the pattern in the photoresist layer 15 into the semiconductor substrate 10, as shown in FIGS. 9A and 9B. The pattern is extended into the substrate by etching, using one or more suitable etchants. The remaining photoresist of the region 50, 52 is at least partially removed during the etching operation in some embodiments. In other embodiments, the remaining photoresist of the region 50, 52 is removed after etching the semiconductor substrate 10 by using a suitable photoresist stripper solvent or by a photoresist ashing operation.

In some embodiments, the resist layer on the surface of the substrate is inspected after the development operation S112 in an after-development inspection (ADI) operation S122 and the developed material residues on the surface of the wafer are mapped. In some embodiments, the etched layer on the surface of the substrate is inspected after the etching operation S114 in an after etching inspection (AEI) operation S123 and the presence of any etching defects and developed material residues on the surface of the wafer are mapped.

In some embodiments, the semiconductor substrate 10 includes a single crystalline semiconductor layer on at least its surface portion. The semiconductor substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the semiconductor substrate 10 is a silicon layer of an SOI (silicon-on insulator) substrate. In certain embodiments, the semiconductor substrate 10 is made of crystalline Si.

The semiconductor substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, and InP. In an embodiment, the silicon germanium (SiGe) buffer layer is epitaxially grown on the semiconductor substrate 10. The germanium concentration of the SiGe buffer layers may increase from 30 atomic % for the bottom-most buffer layer to 70 atomic % for the top-most buffer layer.

In some embodiments, the semiconductor substrate 10 includes one or more layers of at least one metal, metal alloy, and metal nitride/sulfide/oxide/silicide having the formula $MX_a$, where M is a metal and X is N, S, Se, O, Si, and a is from about 0.4 to about 2.5. In some embodiments, the semiconductor substrate 10 includes titanium, aluminum, cobalt, ruthenium, titanium nitride, tungsten nitride, tantalum nitride, and combinations thereof.

In some embodiments, the semiconductor substrate 10 includes a dielectric material having at least a silicon or metal oxide or nitride of the formula $MX_b$, where M is a metal or Si, X is N or O, and b ranges from about 0.4 to about 2.5. In some embodiments, the semiconductor substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive tone or negative tone may determine the type of developer used to develop the resist. For example, some positive tone photoresists provide a positive pattern, (i.e. —the exposed regions are removed by the developer), when the developer is an aqueous-based developer, such as a tetramethylammonium hydroxide (TMAH) solution. On the other hand, the same photoresist provides a negative pattern (i.e. —the unexposed regions are removed by the developer) when the developer is an organic solvent, such as n-butyl acetate (nBA). Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

In some embodiments, the photoresist layer 15 includes a high sensitivity photoresist composition. In some embodiments, the high sensitivity photoresist composition is highly sensitive to extreme ultraviolet (EUV) radiation. In some embodiments, the photoresist composition includes a polymer, a photoactive compound (PAC), and a sensitizer. In some embodiments, the photoresist includes metal nanoparticles.

In some embodiments, the photoresist layer 15 is a tri-layer resist. A tri-layer resist includes a bottom layer, a middle layer, and an upper layer. In some embodiments, the bottom layer is a planarizing layer or a bottom anti-reflective coating (BARC) layer. In some embodiments, the bottom layer is formed of a carbon backbone polymer. In some embodiments, the middle layer is a made of a silicon-containing material. In some embodiments, the middle layer is an anti-reflective layer. The upper layer is a photosensitive layer that is patterned like the photoresist layers described herein.

FIGS. 10A and 10B show an inspection system 600 for inspecting residue or defects on a surface of the substrate and a system that controls gas purging of the substrate in accordance with some embodiments of the present disclosure. In some embodiments, the residues are the developed material residues and/or the water residues on the developed resist pattern of the substrate 220 and the defects are the defects of the etched pattern 230 on the substrate 220. FIG. 10A shows a scanning-imaging device 635 and a lens 634 that generates a uniform light beam 617 for imaging the top surface of the substrate 220 to generate an image of the top surface of substrate 220. In addition, FIG. 10A shows the scanning-imaging device 635 generates a focusing beam 619 for scanning a top surface of the substrate 220 to generate an scanned image of the top surface of the substrate 220. The scanning-imaging device 635 is coupled to an analyzer module 630 that receives the images captured by the scanning-imaging device 635. The analyzer module 630 includes an image processing unit 633 for processing the received images. In FIG. 10A, the substrate 220 is disposed on the stage 520. The stage 520 is coupled and controlled by a stage controller 665. The scanning-imaging device 635 is also couple to the stage controller 665 and receives a location of the wafer being scanned and/or imaged. The scanning-imaging device 635 captures one or more images of the surface of the substrate 220 at different locations of the substrate 220 and sends the images and the locations to the analyzer module 630 or the image processing unit 633. The analyzer module 630 or the image processing unit 633 of the analyzer module 630 determines the number of residues or defects and locations of the residue or defects on the substrate 220, e.g., determines a map of the residues or defects.

FIG. 10B shows a purge system 650 that includes the inspection system 600 coupled to the photoresist development system 800, e.g., to the developer controller 822 of the photoresist development system 800. In some embodiments, if the inspection system 600 determines that the number of residues, or a density of the residues, e.g., residues per square millimeter of the surface of the substrate 220, is above a threshold value, the inspection system 600 sends information 702 to the developer controller 822 and the developer controller 822 increases the duration of the next spin dry operation S158, increases the flow rate of the purge gas, or increases the pressure of the purge gas during the next spin dry operation S158. In some embodiments, if the number of residues, or a density of the residues, on the surface of the substrate 220, is above the threshold value, the inspection system 600 sends the information to the developer controller 822 and the wafer is sent back to the photoresist development system 800 for further water rinse operation S156 and spin dry operation S158. The developer controller 822 increases the duration of the spin dry operation S158, increases the flow rate of the purge gas, or increases the pressure of the purge gas during the spin dry operation S158. In some embodiments, the threshold value of the residue is greater than 1 residue/mm$^2$. In some embodiments, the threshold value of the residue is greater than 0.5 residues/mm$^2$. In other embodiments, the threshold value of the residue is greater than 0.1 residues/mm$^2$.

In some embodiments, if the number of defects, or a density of the defects, e.g., defects per square millimeter of the etched pattern on the surface of the substrate 220, is above a threshold value, the inspection system 600 sends the information to the developer controller 822 and the developer controller 822 increases the duration of the next spin dry operation S158, increases the flow rate of the purge gas, or increases the pressure of the purge gas during the next spin dry operation S158.

Figure 11:
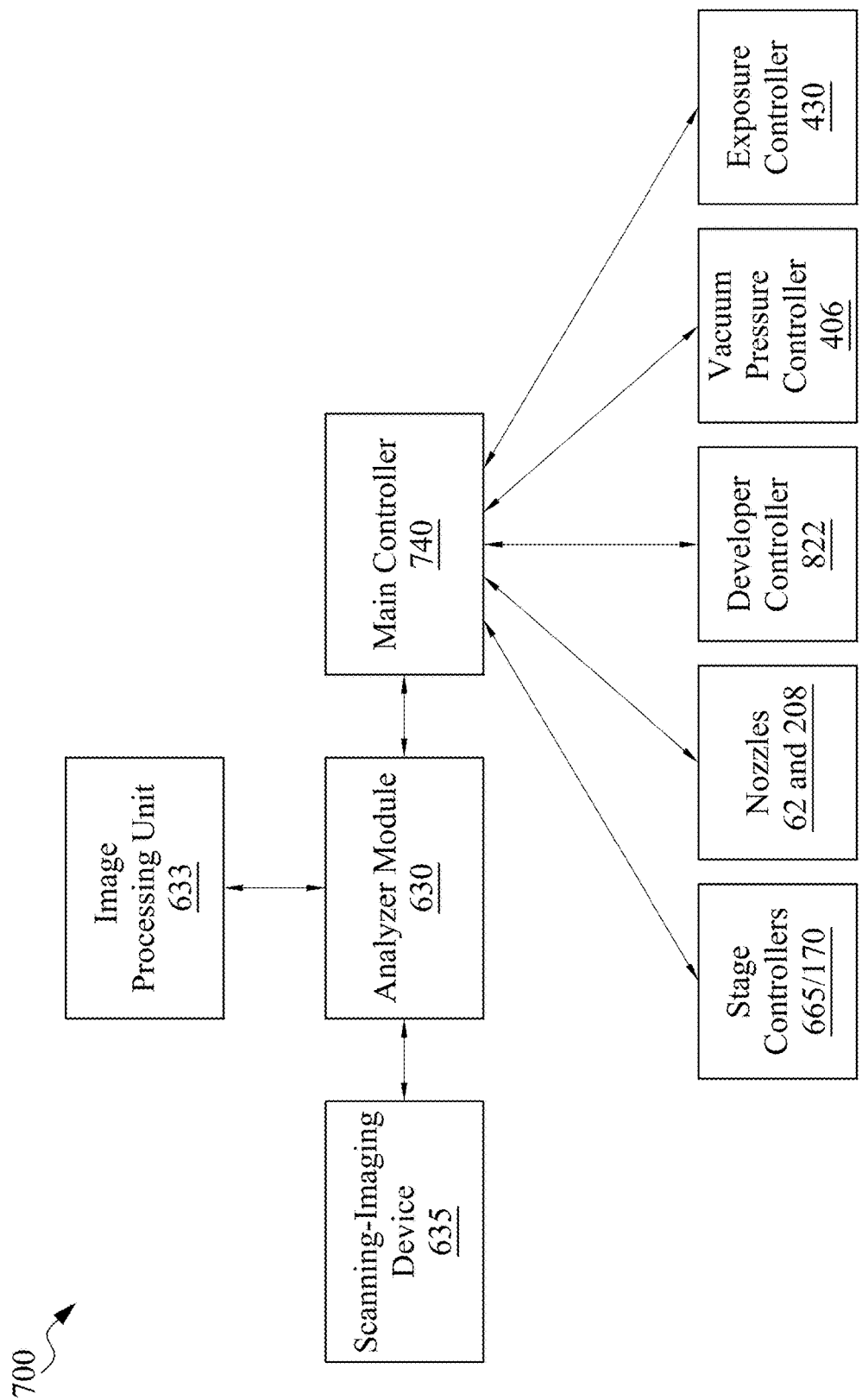
FIG. 11 shows a control system for generating a resist pattern and/or an etched pattern on the substrate in accordance with some embodiments of the present disclosure.

FIG. 11 shows a control system 700 for generating a resist pattern and/or an etched pattern on the substrate in accordance with some embodiments of the present disclosure. The control system 700 includes the analyzer module 630 and a main controller 740 coupled to each other. In some embodiments, the main controller 740 is programmed to: control a spin rate of the stages 160, 520, 825; dispensing of liquid or gas from any of the nozzles 62, 208, 811; translational motion of any of the nozzles 62, 208, 811; and a tilt angle of any of the nozzles 62, 208, 811 relative to surfaces of the substrate. As shown in FIG. 11, the main controller 740 is programmed to control one or more of the analyzer module 630, and the image processing unit 633 and the scanning-imaging device 635 through the analyzer module 630. In addition, the main controller 740 is programmed to control the stage controllers 170, 665; the various nozzles 62, 208, 811; the developer controller 822; the vacuum pressure controller 406; and the exposure controller 430. In some embodiments, the main controller 740 includes the developer controller 822 and in some embodiments, the developer controller 822 controls the scanning-imaging device 635 and the analyzer module 630.

Figure 12:
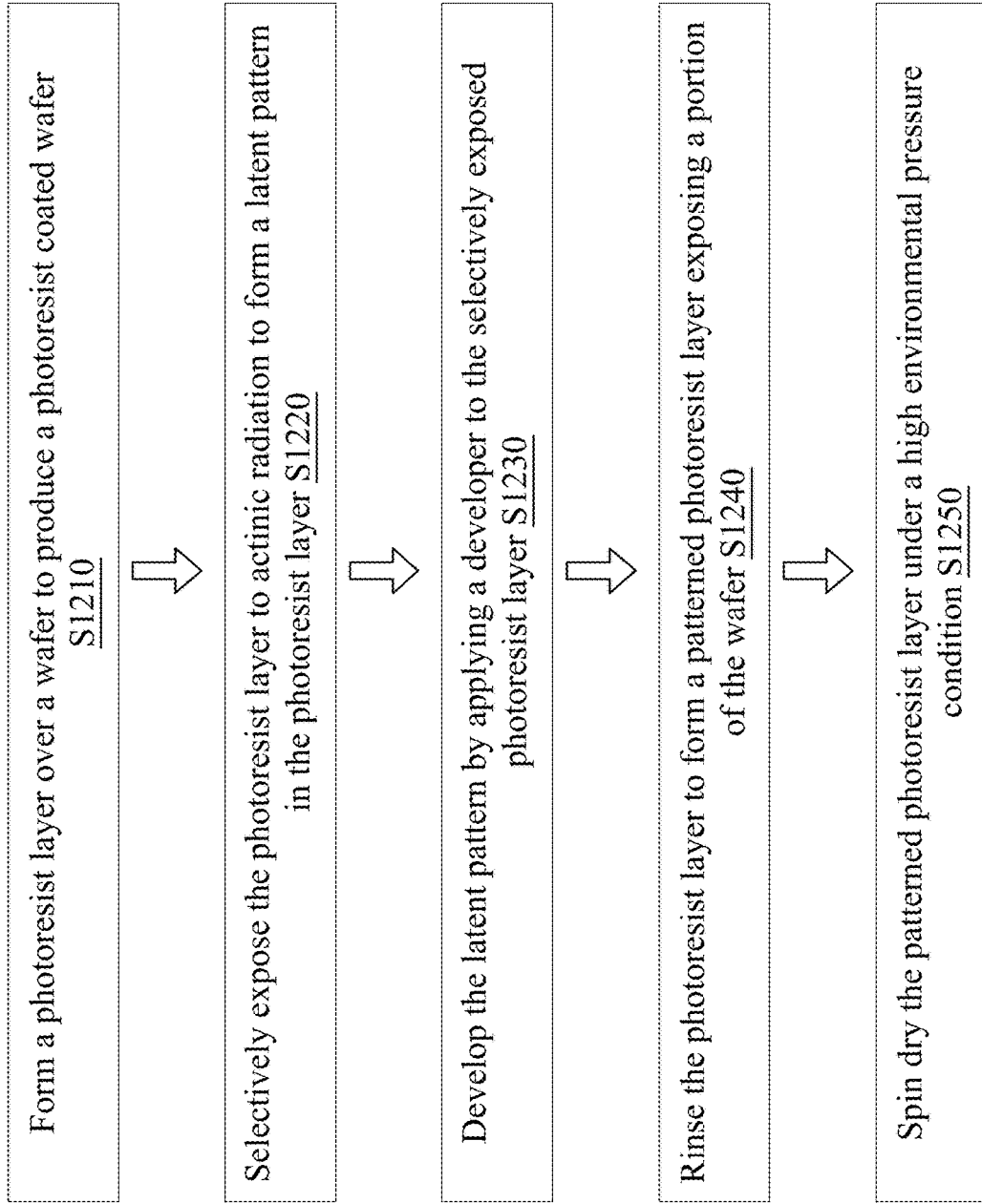
FIG. 12 shows a flow diagram of a process for generating a resist pattern and/or an etched pattern on a substrate in accordance with some embodiments of the present disclosure.

FIG. 12 shows a flow diagram of a process 1200 for generating a resist pattern and/or an etched pattern on a substrate in accordance with some embodiments of the present disclosure. In some embodiments, a photoresist layer 15 on a wafer, e.g., the semiconductor substrate 10, is formed and a photoresist coated wafer is produced in operation S1210. The photoresist layer 15 is selectively exposed to actinic radiation to form a latent pattern in the photoresist layer 15 in operation S1220. The latent pattern is developed by applying a developer, a development material 57, to the selectively exposed photoresist layer 15 as shown in FIG. 4A in operation S1230. The photoresist layer 15 is rinsed to form a patterned photoresist layer exposing a portion of the wafer as shown in FIGS. 6A and 6B in operation S1240. The patterned photo resist layer, e.g., the patterned photoresist layer of FIGS. 6A and 6B is spin dried under the high pressure gas flow setting to remove developed material residues from the patterned photoresist layer in operation S1250.

The resist layer is developed with a photoresist developer (the development material 57) after selectively exposing the resist layer to actinic radiation in operation S1230. The developed photoresist layer 15 is cleaned with a cleaning liquid, such as deionized water, in operation S1240. Then, in operation S1250, a gas purge is applied to the semiconductor substrate 10 to remove residual developed material and cleaning liquid. In some embodiments, the semiconductor substrate 10 is subsequently inspected to verify the sufficiency of the gas purge operation.

Figure 13A:
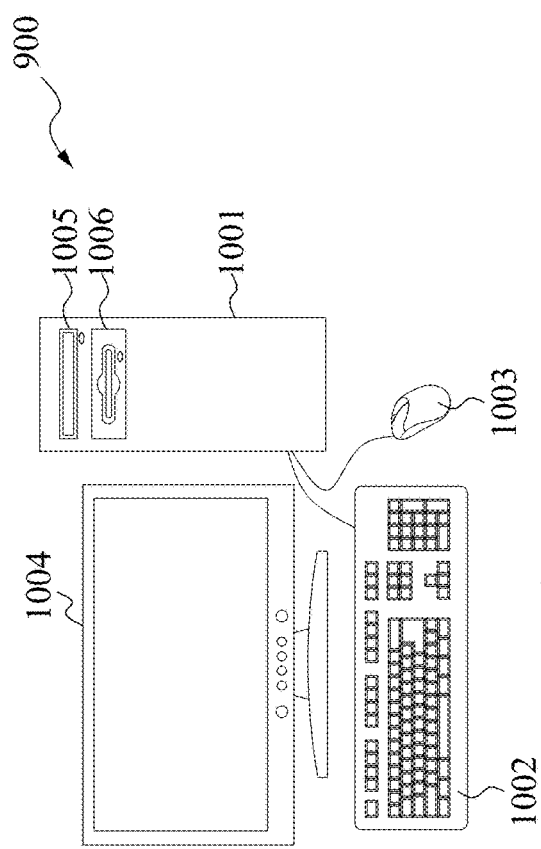
FIGS. 13A and 13B illustrate an apparatus for controlling the system for generating a resist pattern and/or an etched pattern on the substrate in accordance with some embodiments of the present disclosure.
Figure 13B:
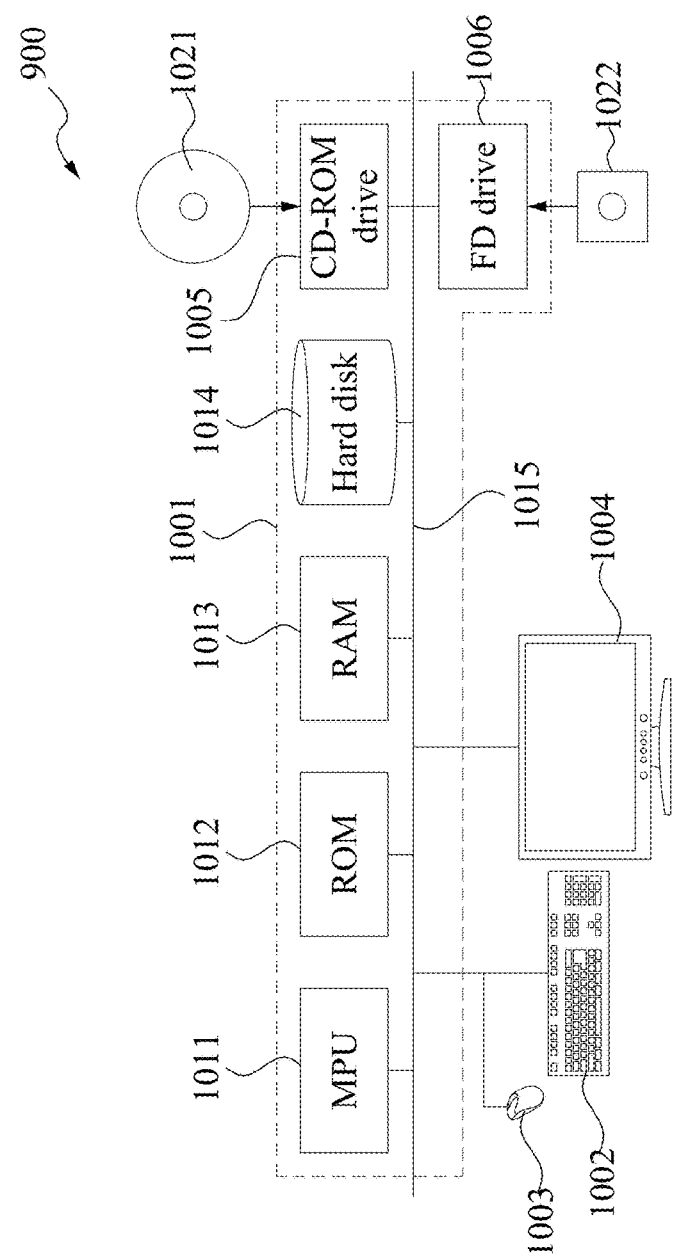

FIGS. 13A and 13B illustrate an apparatus for controlling the method for generating a resist pattern and/or an etched pattern in accordance with some embodiments of the present disclosure. In some embodiments, the computer system 900 is used for performing the functions of the modules of FIG. 11 that include the main controller 740, the analyzer module 630, the stage controller 665 or 170, the vacuum pressure controller 406, and the image processing unit 633 that is included in the analyzer module 630. In some embodiments, the computer system 900 is used to execute the process 100 of FIG. 1 and process 1200 of FIG. 12.

FIG. 13A is a schematic view of a computer system that performs the functions of a controller for controlling the method for generating a resist pattern and/or an etched pattern, including the gas purge of a substrate. All of or a part of the processes, method and/or operations of the foregoing embodiments can be realized using computer hardware and computer programs executed thereon. In FIG. 13A, a computer system 900 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 13B is a diagram showing an internal configuration of the computer system 900. In FIG. 13B, the computer 1001 is provided with, in addition to the optical disk drive 1005 and the magnetic disk drive 1006, one or more processors, such as a micro processing unit (MPU) 1011, a ROM 1012 in which a program such as a boot up program is stored, a random access memory (RAM) 1013 that is connected to the MPU 1011 and in which a command of an application program is temporarily stored and a temporary storage area is provided, a hard disk 1014 in which an application program, a system program, and data are stored, and a bus 1015 that connects the MPU 1011, the ROM 1012, and the like. Note that the computer 1001 may include a network card (not shown) for providing a connection to a LAN.

The program for causing the computer system 900 to execute the functions for generating a resist pattern and/or an etched pattern in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the functions of the control system for generating a resist pattern and/or an etched pattern in the foregoing embodiments. The program may only include a command portion to call an appropriate function (module) in a controlled mode and obtain desired results.

Figure 14:
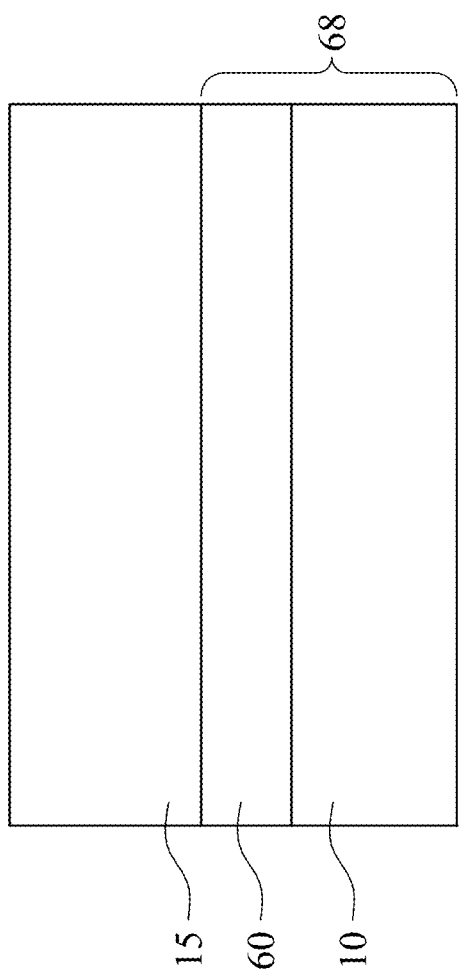
FIG. 14 shows a process stage of a sequential operation according to an embodiment of the disclosure.

FIG. 14 shows a process stage of a sequential operation according to an embodiment of the disclosure. As shown, in some embodiments, the substrate 68 is an in-process substrate 68 and a layer to be patterned 60 is disposed over a bare semiconductor substrate 10 prior to forming the photoresist layer. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 15A:
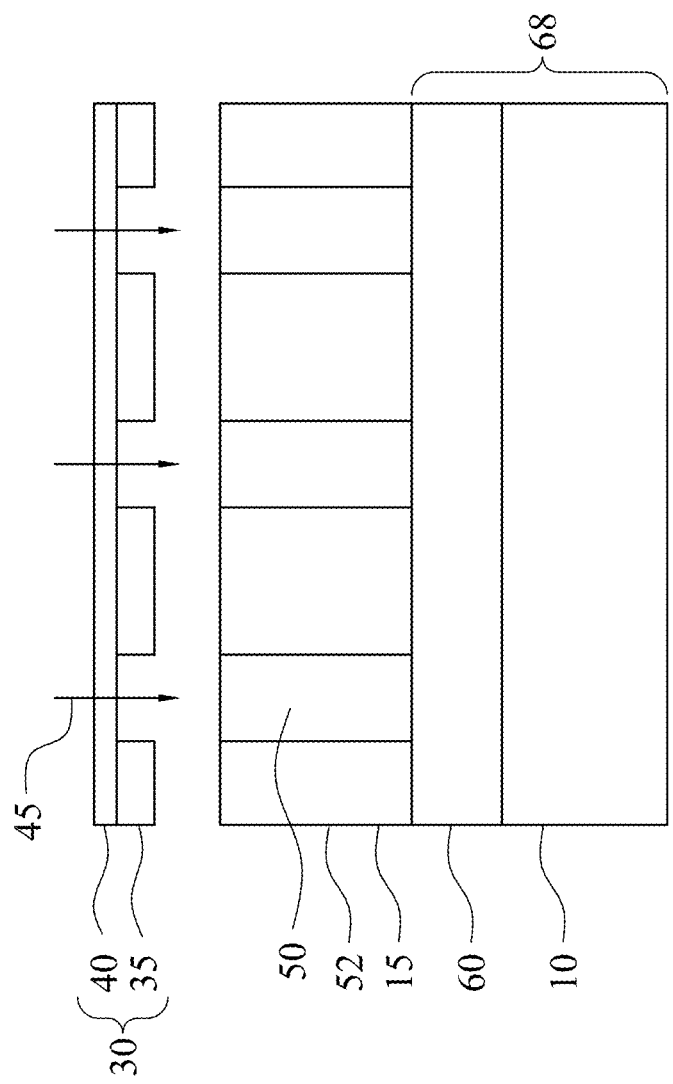
FIGS. 15A and 15B show a process stage of a sequential operation according to an embodiment of the disclosure.
Figure 15B:
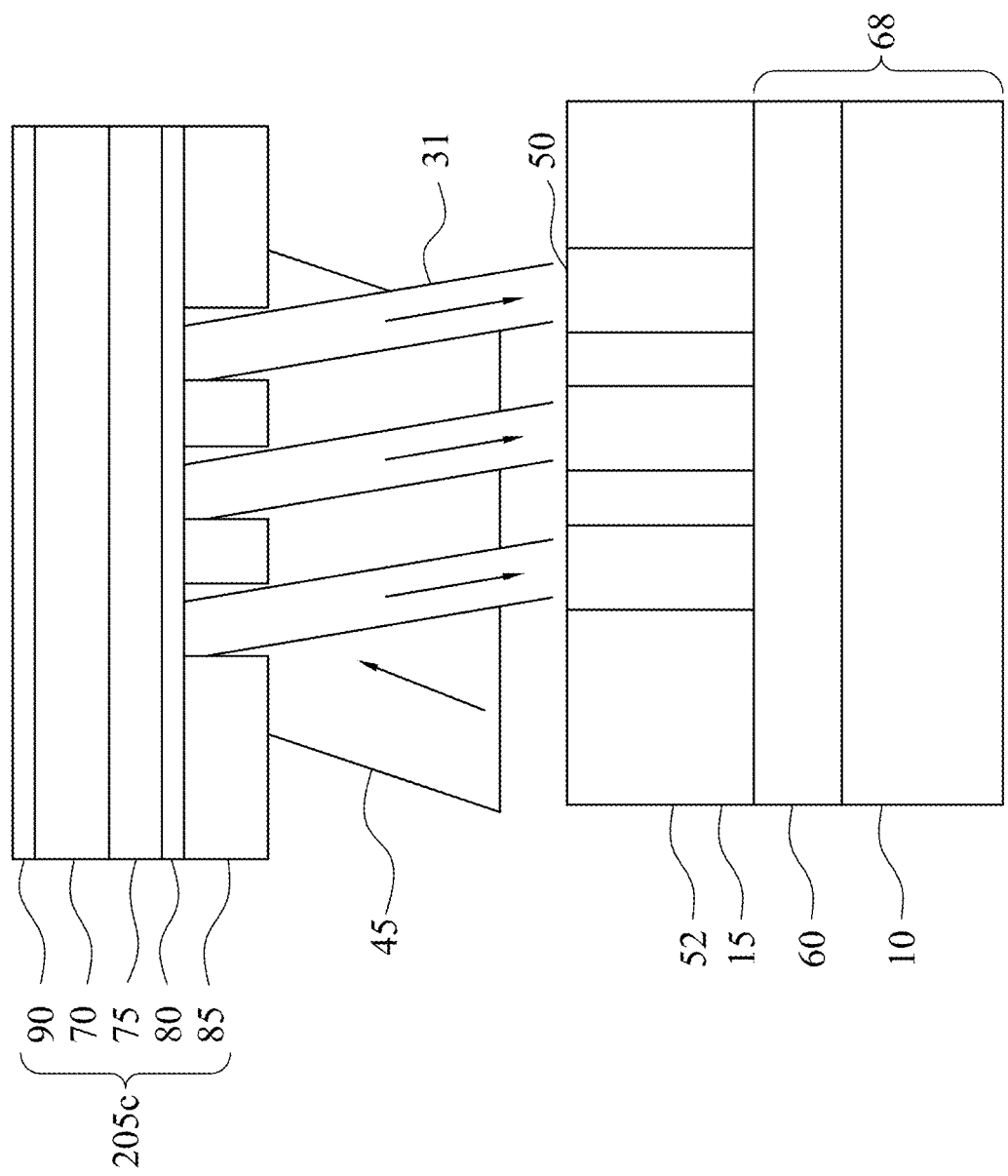

FIGS. 15A and 15B show a process stage of a sequential operation according to an embodiment of the disclosure. The photoresist layer 15 is subsequently selectively exposed or patternwise exposed to actinic radiation 45 to form exposed regions 50 and unexposed regions 52 in the photoresist layer 15, as shown in FIGS. 15A and 15B, as described herein in relation to FIGS. 4A and 4B. As shown in FIG. 15B, the EUV patterned beam 31, reflected from the photomask 205c, is directed to the photoresist layer 15.

FIG. 16 shows a process stage of a sequential operation according to an embodiment of the disclosure. As shown in FIG. 16, the selectively exposed or patternwise exposed photoresist layer 15 is developed by dispensing development material 57 from a nozzle 62 to form a pattern of photoresist openings to produce the pattern of openings 55a, 55b, in the photoresist layer over the in-process substrate 68, as shown in FIGS. 17A and 17B, as described herein in relation to FIGS. 5, 6A, and 6B.

Figure 17B:
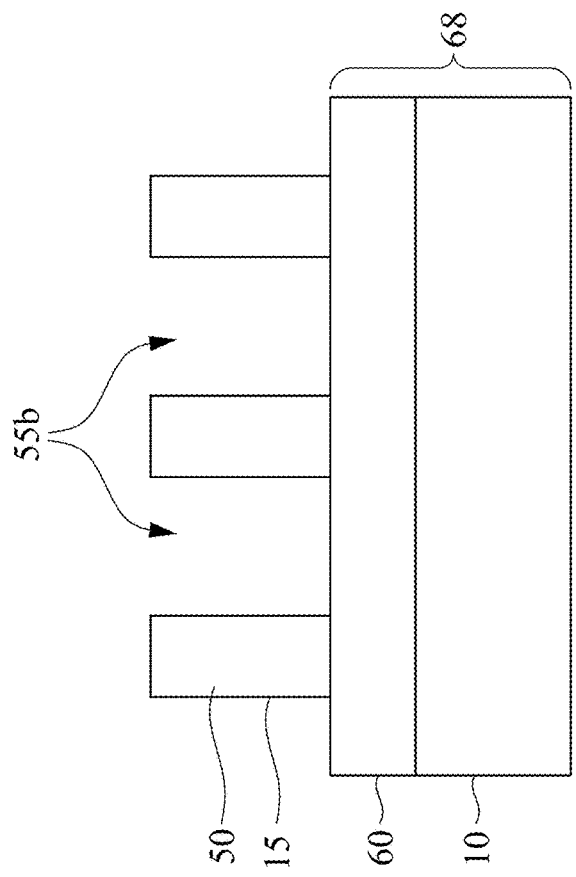
FIGS. 17A and 17B show a process stage of a sequential operation according to an embodiment of the disclosure.
Figure 17A:
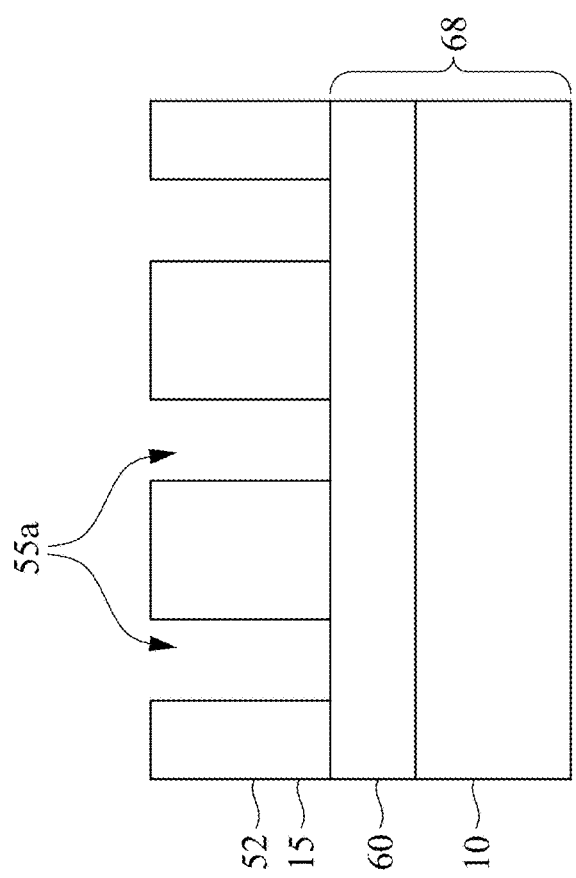

FIGS. 17A and 17B show a process stage of a sequential operation according to an embodiment of the disclosure. FIG. 17A illustrates the development of a positive tone photoresist pattern, and FIG. 17B illustrates the development of a negative tone photoresist pattern. The resist patterns are generated using the photoresist development system 800 of FIG. 8A.

Figure 18A:
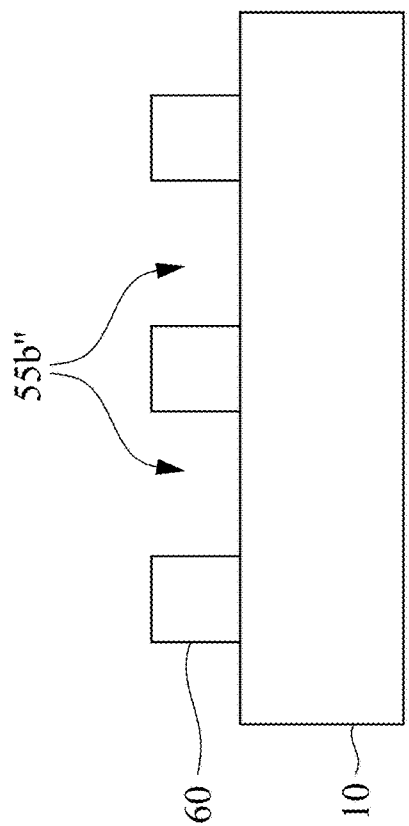
FIGS. 18A and 18B show a process stage of a sequential operation according to an embodiment of the disclosure.
Figure 18B:
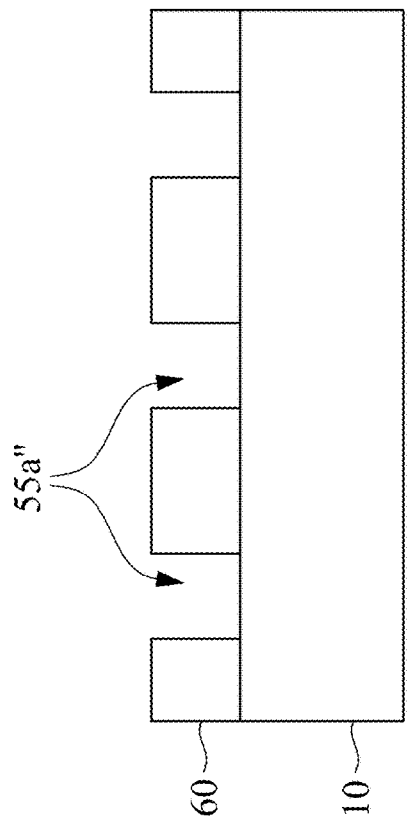

FIGS. 18A and 18B show a process stage of a sequential operation according to an embodiment of the disclosure.

Then, as shown in FIGS. 18A and 18B, the pattern of openings 55a, 55b (see FIGS. 17A and 17B) in the photoresist layer 15 is transferred to the layer to be patterned 60 using an etching operation and the photoresist layer is removed, as explained with reference to FIGS. 9A and 9B to form the pattern of openings 55a'', 55b'' in the layer to be patterned 60.

The techniques to apply a purge gas at high pressure or flow rate described herein are not limited to removing developed material residues from semiconductor substrates. In some embodiments, the techniques disclosed herein are used to remove excess amounts and residues of other coatings. For example, in some embodiments, the techniques are used to remove excess or residues of photoresist coatings; polymeric insulating layers, including polyimide layers; bottom anti-reflective coating (BARC) layers; top anti-reflective coating (TARC) layers; and spin-on-glass (SOG) layers. The gas purge techniques can be used to blow away any chemicals from the surface of the substrate.

Other embodiments include other operations before, during, or after the operations described above. In some embodiments, the disclosed methods include forming semiconductor devices, including fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

As described in the foregoing embodiments, at the end of the development process the substrate undergoes the spin dry operation S158 such that developed material residues and/or DI wafer residues are removed from the surface of the wafer. Removal of the residues cause the layout pattern to form, without error or defect, on a resist layer on the surface of the wafer and, thus, when the resist layer is used for etching, the defects in etched pattern is reduced. In some embodiments, the amount of residue is significantly reduced, such that there are only several residue particles remaining on a wafer. In some embodiments, the amount of residue particles on the wafer after the spin dry operation S158 is less than 0.1 particles/mm$^2$. In some embodiments, no residue particles are detected on a wafer after the spin dry operation S158. In some embodiments, the methods described above removes the DI water that has splashed from the backside, e.g., removes the effects of back splashing. In some embodiments, the methods and systems described above, prevents line collapse and hole blinding, enlarges the processing window, reduces the number of defects, improves critical dimension uniformity, and causes yield improvement.

According to some embodiments of the present disclosure, a method for manufacturing a semiconductor device includes forming a photoresist layer including a photoresist composition over a wafer to produce a photoresist-coated wafer and selectively exposing the photoresist layer to actinic radiation to form a latent pattern in the photoresist layer. The method also includes developing the latent pattern by applying a developer to the selectively exposed photoresist layer under a first pressure gas flow setting in a development chamber and rinsing the photoresist layer to form a patterned photoresist layer exposing a portion of the wafer under the first pressure gas flow setting in the development chamber. The method also includes spin drying the patterned photoresist layer under a second pressure gas flow setting in the development chamber. A pressure of the development chamber under the second pressure gas flow setting is greater than the pressure of the development chamber under the first pressure gas flow setting. In an embodiment, the method further includes flowing a purge gas from a nozzle into an enclosure of a development system that includes the development chamber inside the enclosure. The purge gas flows over the wafer during the developing, the rinsing, and the spin drying. A gas flow rate of the purge gas over the wafer in the development chamber under the second pressure gas flow setting is greater than the gas flow rate under the first pressure gas flow setting. In an embodiment, the method further includes opening a first entrance port of a shutter system coupled to an exit port of the development chamber to modify the first pressure gas flow setting to the second pressure gas flow setting. In an embodiment, the method further includes after the spin drying, determining an amount of developed material residue on the wafer, and when the amount of developed material residue exceeds a threshold amount, changing a parameter of the second pressure gas flow setting for a next spin drying. In an embodiment, one or more parameters of the second pressure gas flow setting include at least one of a flow rate setting in the development chamber or a pressure setting of the development chamber. In an embodiment, the purge gas is one or more gases selected from the group consisting of clean dry air, nitrogen, argon, helium, neon, and carbon dioxide. In an embodiment, the wafer is rotated while the purge gas is applied during the spin drying at a speed between about 100 rpm and about 2000 rpm. In an embodiment, the first pressure gas flow rate of a purge gas during the spin drying in the development chamber is between about 800 cc/s and 1200 cc/s and the pressure of the development chamber is between about 120 kPa and 140 kPa, and the second pressure gas flow setting of the flow rate of the purge gas during the spin drying in the development chamber is between about 250 cc/s and 150 cc/s and the pressure of the development chamber is between about 45 kPa and 65 kPa. In an embodiment, the shutter system includes a second entrance port coupled to the enclosure of the development system outside the development chamber. A remaining portion of the purge gas flows through the second entrance port to the shutter system and the method further includes reducing an opening size of the second entrance port to increase the flow rate of the purge gas in the development chamber.

According to some embodiments of the present disclosure, a method for manufacturing a semiconductor device includes forming a photoresist layer over an in-process substrate. The in-process substrate includes a plurality of devices and conductive power and signal routing interconnections for the plurality of devices. The method also includes patternwise exposing the photoresist layer to actinic radiation to form a latent pattern in the photoresist layer and applying a developer solution to the latent pattern to form a pattern in the photoresist layer under a first pressure gas flow setting in a development chamber. The method further includes applying deionized water to the pattern after applying the developer solution to form a patterned photoresist layer under a first pressure gas flow setting in a development chamber and spin drying the patterned photoresist layer under a second pressure gas flow setting in the development chamber to reduces developed material residues and water residues from the patterned photoresist layer on the in-process substrate. A pressure of the development chamber under the second pressure gas flow setting is greater than the pressure of the development chamber under the first pressure gas flow setting. In an embodiment, the method further includes flowing a gas over the in-process substrate during the applying the developer, the applying the deionized water, and the spin drying. A gas flow rate of the gas in the development chamber under the second pressure gas flow setting is greater than the gas flow rate of the gas under the first pressure gas flow setting. In an embodiment, the applying the developer, the applying the deionized water, and the spin drying are performed in a development chamber, parameters of the second pressure gas flow setting includes setting a flow rate of the gas in the development chamber and setting a pressure of the development chamber, and during the spin drying, a gas flow rate in the development chamber is between about 800 cc/s and 1200 cc/s and a pressure in the development chamber is between about 120 kPa and 160 kPa. In an embodiment, the method further includes periodically alternating the pressure of the development chamber between about 120 kPa and about 160 kPa and periodically alternating the gas flow rate between 800 cc/s and about 1200 cc/s during the spin drying. In an embodiment, the spin drying is performed for about 10 seconds to about 20 minutes.

According to some embodiments of the present disclosure, a photoresist development system of a system for semiconductor device manufacturing includes a development chamber that includes a rotatable wafer stage to support a photoresist-coated wafer. The system also includes a nozzle disposed above the development chamber to apply a first stream of gas over the rotatable wafer stage in the development chamber, an exhaust gas port, and an exhaust system that includes a movable shutter coupled between the development chamber and the exhaust gas port. The system further includes a controller coupled through a gas source to the nozzle, coupled to the rotatable wafer stage, and coupled to the exhaust system, the controller performs: control a spin rate of the rotatable wafer stage, control a flow rate of a second stream of gas exiting from the nozzle, and control the movable shutter of the exhaust system such that by adjusting a location of the movable shutter, the controller adjusts a flow rate of the first stream of gas entering the development chamber and to adjust a pressure of the development chamber. In an embodiment, the photoresist development system includes a body and an enclosure surrounded by the body, the development chamber is located inside the enclosure and occupies a first portion of the enclosure, the exhaust system includes a first entrance port coupled to the development chamber and a second entrance port coupled to a second portion of the enclosure outside the development chamber, and by moving the movable shutter a ratio of a flow rate of the first stream of gas entering the development chamber to a flow rate of a third stream of gas entering the second portion of the enclosure is adjusted and the pressure of the development chamber is adjusted. In an embodiment, the movable shutter is a damper that rotates around a hinge and by rotating around the hinge, the damper opens and/or closes the second entrance port and adjusts the ratio of the flow rate of the first stream of gas to the flow rate of the third stream of gas and adjust the pressure of the development chamber. In an embodiment, the movable shutter is a sliding shutter that moves horizontally and by moving, the movable shutter opens and/or closes the second entrance port and adjust the ratio of the flow rate of the first stream of gas to the flow rate of the third stream of gas and adjusts the pressure of the development chamber. In an embodiment, the system further includes an inspection tool to inspect a surface of the photoresist-coated wafer. The inspection tool includes a wafer inspection support stage, a scanning-imaging device, and an analyzer module. The controller controls the wafer inspection support stage, the scanning/imaging device, and the analyzer module. In an embodiment, the system further includes adjusting the flow rate of the second stream of gas to adjust the flow rate of the first stream of gas entering the development chamber and to adjust the pressure of the development chamber.

As described in the foregoing embodiments, at the end of the development process during spin drying the substrate is purged by high pressure gas such that developed material and/or DI wafer residues are further removed from the surface of the wafer. Removal of the residues cause the layout pattern to form, without error or defect, on a resist layer on the surface of the wafer and, thus, when the resist layer is used for etching, the defects in etched pattern is reduced and the critical dimension uniformity increases.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a photoresist layer comprising a photoresist composition over a wafer to produce a photoresist-coated wafer;
    selectively exposing the photoresist layer to actinic radiation to form a latent pattern in the photoresist layer;
    developing the latent pattern by applying a developer to the selectively exposed photoresist layer under a first pressure gas flow setting in a development chamber;

rinsing the photoresist layer to form a patterned photoresist layer exposing a portion of the wafer under the first pressure gas flow setting in the development chamber; and spin drying the patterned photoresist layer under a second pressure gas flow setting in the development chamber, wherein a pressure of the development chamber under the second pressure gas flow setting is greater than the pressure of the development chamber under the first pressure gas flow setting.

2. The method of claim 1, further comprising:
flowing a purge gas from a nozzle into an enclosure of a development system that includes the development chamber inside the enclosure, wherein the purge gas flows over the wafer during the developing, the rinsing, and the spin drying, wherein a gas flow rate of the purge gas over the wafer in the development chamber under the second pressure gas flow setting is greater than the gas flow rate under the first pressure gas flow setting.

3. The method of claim 2, further comprising:
opening a first entrance port of a shutter system coupled to an exit port of the development chamber to modify the first pressure gas flow setting to the second pressure gas flow setting.

4. The method of claim 3, further comprising:
after the spin drying, determining an amount of developed material residue on the wafer, and wherein when the amount of developed material residue exceeds a threshold amount, changing a parameter of the second pressure gas flow setting for a next spin drying.

5. The method of claim 4, wherein one or more parameters of the second pressure gas flow setting comprise at least one of a flow rate setting in the development chamber or a pressure setting of the development chamber.

6. The method of claim 2, wherein the purge gas is one or more gases selected from the group consisting of clean dry air, nitrogen, argon, helium, neon, and carbon dioxide.

7. The method of claim 6, wherein the wafer is rotated while the purge gas is applied during the spin drying at a speed between about 100 rpm and about 2000 rpm.

8. The method of claim 5, wherein the first pressure gas flow setting comprises the gas flow rate of the purge gas during the spin drying in the development chamber is between about 800 cc/s and 1200 cc/s and the pressure of the development chamber is between about 120 kPa and 140 kPa, and wherein the second pressure gas flow setting comprises the gas flow rate of the purge gas during the spin drying in the development chamber is between about 250 cc/s and 150 cc/s and the pressure of the development chamber is between about 45 kPa and 65 kPa.

9. The method of claim 3, wherein the shutter system comprises a second entrance port coupled to the enclosure of the development system outside the development chamber, and wherein a remaining portion of the purge gas flows through the second entrance port to the shutter system, and the method further comprises reducing an opening size of the second entrance port to increase the gas flow rate of the purge gas in the development chamber.

10. A method for manufacturing a semiconductor device, comprising:
forming a photoresist layer over an in-process substrate, wherein the in-process substrate comprises a plurality of devices and conductive power and signal routing interconnections for the plurality of devices;
patternwise exposing the photoresist layer to actinic radiation to form a latent pattern in the photoresist layer;
applying a developer solution to the latent pattern to form a pattern in the photoresist layer under a first pressure gas flow setting in a development chamber;
applying deionized water to the pattern after applying the developer solution to form the patterned photoresist layer under the first pressure gas flow setting in the development chamber; and
spin drying the patterned photoresist layer under a second pressure gas flow setting in the development chamber to reduce developed material residues and water residues from the patterned photoresist layer on the in-process substrate, wherein a pressure of the development chamber under the second pressure gas flow setting is greater than the pressure of the development chamber under the first pressure gas flow setting.

11. The method according to claim 10, further comprising:
flowing a gas over the in-process substrate during the applying the developer solution, the applying the deionized water, and the spin drying, wherein a gas flow rate of the gas in the development chamber under the second pressure gas flow setting is greater than the gas flow rate of the gas under the first pressure gas flow setting.

12. The method according to claim 10, wherein:
the applying the developer solution, the applying the deionized water, and the spin drying are performed in the development chamber,
parameters of the second pressure gas flow setting comprise setting a gas flow rate of a gas in the development chamber and setting a pressure of the development chamber, and
during the spin drying, the gas flow rate in the development chamber is between about 800 cc/s and 1200 cc/s and a pressure in the development chamber is between about 120 kPa and 160 kPa.

13. The method of claim 12, further comprising:
during the spin drying, periodically alternating the pressure of the development chamber between about 120 kPa and about 160 kPa and periodically alternating the gas flow rate between 800 cc/s and about 1200 cc/s.

14. The method according to claim 11, wherein the spin drying is performed for about 10 seconds to about 20 minutes.

15. A method for manufacturing a semiconductor device, comprising:
forming a photoresist layer over a wafer;
selectively exposing the photoresist layer to actinic radiation to form a latent pattern in the photoresist layer;
developing the latent pattern under a first pressure gas flow setting in a development chamber;
rinsing the photoresist layer to form a patterned photoresist layer exposing a portion of the wafer under the first pressure gas flow setting in the development chamber; and
spin drying the patterned photoresist layer under a second pressure gas flow setting in the development chamber, wherein a pressure of the development chamber under the second pressure gas flow setting is greater than the pressure of the development chamber under the first pressure gas flow setting, and during the spin drying, periodically alternating the pressure of the development chamber under the second pressure gas flow setting between a first pressure and a second pressure, and a second pressure is greater than the first pressure.

16. The method of claim 15, further comprising:
flowing a purge gas from a nozzle into an enclosure of a development system that includes the development chamber inside the enclosure, wherein the purge gas flows over the wafer during the developing, the rinsing, and the spin drying, wherein a gas flow rate of the purge gas over the wafer in the development chamber under the second pressure gas flow setting is greater than the gas flow rate under the first pressure gas flow setting.

17. The method of claim 16, further comprising:
opening a first entrance port of a shutter system coupled to an exit port of the development chamber to modify the first pressure gas flow setting to the second pressure gas flow setting.

18. The method of claim 17, further comprising:
after the spin drying, determining an amount of developed material residue on the wafer, and wherein when the amount of developed material residue exceeds a threshold amount, changing a parameter of the second pressure gas flow setting for a next spin drying.

19. The method of claim 18, wherein one or more parameters of the second pressure gas flow setting comprise at least one of a flow rate setting in the development chamber or a pressure setting of the development chamber.

20. The method of claim 16, wherein the purge gas is at least one gas selected from the group consisting of clean dry air, nitrogen, argon, helium, neon, and carbon dioxide.

* * * * *